United States Patent
Yantchev et al.

(10) Patent No.: US 12,191,837 B2
(45) Date of Patent: Jan. 7, 2025

(54) SOLIDLY-MOUNTED TRANSVERSELY-EXCITED FILM BULK ACOUSTIC DEVICE

(71) Applicant: Murata Manufacturing Co., Ltd., Nagaokakyo (JP)

(72) Inventors: Ventsislav Yantchev, Sofia (BG); Bryant Garcia, Mississauga (CA); Viktor Plesski, Gorgier (CH); Soumya Yandrapalli, Lausanne (CH); Robert B. Hammond, Santa Barbara, CA (US); Patrick Turner, San Bruno, CA (US); Jesson John, Dublin, CA (US)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 527 days.

(21) Appl. No.: 17/520,687

(22) Filed: Nov. 7, 2021

(65) Prior Publication Data
US 2022/0060170 A1    Feb. 24, 2022

Related U.S. Application Data

(60) Continuation-in-part of application No. 17/361,046, filed on Jun. 28, 2021, now Pat. No. 12,088,272, and
(Continued)

(51) Int. Cl.
*H03H 9/02* (2006.01)
*H03H 3/02* (2006.01)
(Continued)

(52) U.S. Cl.
CPC .......... *H03H 9/02228* (2013.01); *H03H 3/02* (2013.01); *H03H 9/02031* (2013.01);
(Continued)

(58) Field of Classification Search
CPC .. H03H 9/02228; H03H 3/02; H03H 9/02031; H03H 9/132; H03H 9/175;
(Continued)

(56) References Cited

U.S. PATENT DOCUMENTS 5,274,345 A    12/1993    Gau
5,446,330 A    8/1995    Eda et al.
(Continued)

FOREIGN PATENT DOCUMENTS

CN    113765495 A    12/2021
JP    10-209804 A    8/1998
(Continued)

OTHER PUBLICATIONS

Buchanan "Ceramic Materials for Electronics" 3rd Edition, first published in 2004 by Marcel Dekker, Inc. pp. 496 (Year 2004). Jan. 2004.
(Continued)

*Primary Examiner* — Jeffrey T Carley
*Assistant Examiner* — Jose K Abraham
(74) *Attorney, Agent, or Firm* — ARENTFOX SCHIFF LLP

(57) ABSTRACT

Resonator and filter devices and methods of fabrication. A resonator chip includes a substrate, a piezoelectric plate, and an acoustic Bragg reflector between the substrate and a back surface of the piezoelectric plate. A conductor pattern on a front surface of the piezoelectric plate includes a first plurality of contact pads and an interdigital transducer (IDT). The IDT and the piezoelectric plate are configured such that a radio frequency signal applied to the IDT excites a shear primary acoustic mode within the piezoelectric plate. The acoustic Bragg reflector is configured to reflect the shear primary acoustic mode. An interposer has a second plurality of contact pads on a back surface. A seal connects a
(Continued)

perimeter of the piezoelectric plate to a perimeter of the interposer. Each contact pad of the first plurality of contact pads is directly connected to a respective contact pad of the second plurality of contact pads.

17 Claims, 16 Drawing Sheets

Related U.S. Application Data a continuation-in-part of application No. 16/998,300, filed on Aug. 20, 2020, which is a division of application No. 16/841,134, filed on Apr. 6, 2020, now Pat. No. 10,819,309, said application No. 17/361,046 is a continuation of application No. 16/779,306, filed on Jan. 31, 2020, now Pat. No. 11,165,407, which is a continuation of application No. 16/438,141, filed on Jun. 11, 2019, now Pat. No. 10,601,392, which is a continuation-in-part of application No. 16/230,443, filed on Dec. 21, 2018, now Pat. No. 10,491,192.

(60) Provisional application No. 62/904,416, filed on Sep. 23, 2019, provisional application No. 62/881,749, filed on Aug. 1, 2019, provisional application No. 62/830,258, filed on Apr. 5, 2019, provisional application No. 62/818,564, filed on Mar. 14, 2019, provisional application No. 62/753,815, filed on Oct. 31, 2018, provisional application No. 62/753,809, filed on Oct. 31, 2018, provisional application No. 62/748,883, filed on Oct. 22, 2018, provisional application No. 62/741,702, filed on Oct. 5, 2018, provisional application No. 62/701,363, filed on Jul. 20, 2018, provisional application No. 62/685,825, filed on Jun. 15, 2018.

(51) Int. Cl.
*H03H 9/13* (2006.01)
*H03H 9/17* (2006.01)
*H03H 9/56* (2006.01)

(52) U.S. Cl.
CPC ............ *H03H 9/132* (2013.01); *H03H 9/175* (2013.01); *H03H 9/176* (2013.01); *H03H 9/562* (2013.01); *H03H 9/564* (2013.01); *H03H 9/568* (2013.01); *H03H 2003/025* (2013.01)

(58) Field of Classification Search
CPC ........ H03H 9/176; H03H 9/562; H03H 9/564; H03H 9/568; H03H 2003/025; H03H 9/1014; H03H 9/1071; H03H 9/1085; H03H 9/00
See application file for complete search history.

(56) References Cited

U.S. PATENT DOCUMENTS

| | | |
|---|---|---|
| 5,552,655 A | 9/1996 | Stokes et al. |
| 5,726,610 A | 3/1998 | Allen et al. |
| 5,853,601 A | 12/1998 | Krishaswamy |
| 6,377,140 B1 | 4/2002 | Ehara et al. |
| 6,516,503 B1 | 2/2003 | Ikada et al. |
| 6,540,827 B1 | 4/2003 | Levy et al. |
| 6,570,470 B2 | 5/2003 | Maehara et al. |
| 6,707,229 B1 | 3/2004 | Martin |
| 6,710,514 B2 | 3/2004 | Ikada et al. |
| 6,833,774 B2 | 12/2004 | Abbott et al. |
| 7,042,132 B2 | 5/2006 | Bauer et al. |
| 7,345,400 B2 | 3/2008 | Nakao et al. |
| 7,463,118 B2 | 12/2008 | Jacobsen |
| 7,535,152 B2 | 5/2009 | Ogami et al. |
| 7,684,109 B2 | 3/2010 | Godshalk et al. |
| 7,728,483 B2 | 6/2010 | Tanaka |
| 7,868,519 B2 | 1/2011 | Umeda |
| 7,939,987 B1 | 5/2011 | Solal et al. |
| 7,941,103 B2 | 5/2011 | Iwamoto et al. |
| 7,965,015 B2 | 6/2011 | Tai et al. |
| 8,278,802 B1 | 10/2012 | Lee et al. |
| 8,294,330 B1 * | 10/2012 | Abbott ............... H03H 9/02834 310/365 |
| 8,344,815 B2 | 1/2013 | Yamanaka et al. |
| 8,816,567 B2 | 8/2014 | Zuo et al. |
| 8,829,766 B2 | 9/2014 | Milyutin et al. |
| 8,932,686 B2 | 1/2015 | Hayakawa et al. |
| 9,093,979 B2 | 7/2015 | Wang |
| 9,112,134 B2 | 8/2015 | Takahashi |
| 9,130,145 B2 | 9/2015 | Martin et al. |
| 9,148,121 B2 | 9/2015 | Inoue |
| 9,219,466 B2 | 12/2015 | Meltaus et al. |
| 9,240,768 B2 | 1/2016 | Nishihara et al. |
| 9,276,557 B1 | 3/2016 | Nordquist et al. |
| 9,369,105 B1 | 6/2016 | Li et al. |
| 9,425,765 B2 | 8/2016 | Rinaldi |
| 9,438,202 B2 * | 9/2016 | Reinhardt ............... H03H 9/585 |
| 9,525,398 B1 | 12/2016 | Olsson |
| 9,564,873 B2 | 2/2017 | Kadota |
| 9,640,750 B2 | 5/2017 | Nakanishi et al. |
| 9,748,923 B2 | 8/2017 | Kando et al. |
| 9,762,202 B2 | 9/2017 | Thalmayr et al. |
| 9,780,759 B2 | 10/2017 | Kimura et al. |
| 9,837,984 B2 | 12/2017 | Khlat et al. |
| 10,079,414 B2 | 9/2018 | Guyette et al. |
| 10,187,039 B2 | 1/2019 | Komatsu et al. |
| 10,200,013 B2 | 2/2019 | Bower et al. |
| 10,211,806 B2 | 2/2019 | Bhattacharjee |
| 10,284,176 B1 | 5/2019 | Solal |
| 10,491,192 B1 | 11/2019 | Plesski et al. |
| 10,601,392 B2 | 3/2020 | Plesski et al. |
| 10,637,438 B2 | 4/2020 | Garcia et al. |
| 10,644,674 B2 | 5/2020 | Takamine |
| 10,756,697 B2 | 8/2020 | Plesski et al. |
| 10,790,802 B2 | 9/2020 | Yantchev et al. |
| 10,797,675 B2 | 10/2020 | Plesski |
| 10,812,048 B2 | 10/2020 | Nosaka |
| 10,819,309 B1 | 10/2020 | Turner et al. |
| 10,826,462 B2 | 11/2020 | Plesski et al. |
| 10,868,510 B2 | 12/2020 | Yantchev et al. |
| 10,868,512 B2 | 12/2020 | Garcia et al. |
| 10,868,513 B2 | 12/2020 | Yantchev |
| 10,911,017 B2 | 2/2021 | Plesski |
| 10,911,021 B2 | 2/2021 | Turner et al. |
| 10,911,023 B2 | 2/2021 | Turner |
| 10,917,070 B2 | 2/2021 | Plesski et al. |
| 10,917,072 B2 | 2/2021 | McHugh et al. |
| 10,985,726 B2 | 4/2021 | Plesski |
| 10,985,728 B2 | 4/2021 | Plesski et al. |
| 10,985,730 B2 | 4/2021 | Garcia |
| 10,992,282 B1 | 4/2021 | Plesski et al. |
| 10,992,283 B2 | 4/2021 | Plesski et al. |
| 10,992,284 B2 | 4/2021 | Yantchev |
| 10,998,877 B2 | 5/2021 | Turner et al. |
| 10,998,882 B2 | 5/2021 | Yantchev et al. |
| 11,003,971 B2 | 5/2021 | Plesski et al. |
| 11,146,232 B2 | 10/2021 | Yandrapalli et al. |
| 11,201,601 B2 | 12/2021 | Yantchev et al. |
| 11,418,167 B2 | 8/2022 | Garcia |
| 2002/0079986 A1 | 6/2002 | Ruby et al. |
| 2002/0109564 A1 | 8/2002 | Tsai et al. |
| 2002/0130736 A1 | 9/2002 | Mukai |
| 2002/0158714 A1 | 10/2002 | Kaitila et al. |
| 2002/0189062 A1 | 12/2002 | Lin et al. |
| 2002/0190814 A1 | 12/2002 | Yamada et al. |
| 2003/0080831 A1 | 5/2003 | Naumenko et al. |
| 2003/0199105 A1 | 10/2003 | Kub et al. |
| 2004/0041496 A1 | 3/2004 | Imai et al. |
| 2004/0100164 A1 | 5/2004 | Murata et al. |
| 2004/0207033 A1 | 10/2004 | Koshido |

(56) References Cited

U.S. PATENT DOCUMENTS

| | | | |
|---|---|---|---|
| 2004/0207059 A1* | 10/2004 | Hong | H01L 23/3135 257/E23.126 |
| 2004/0207485 A1 | 10/2004 | Kawachi et al. | |
| 2004/0209387 A1* | 10/2004 | Hong | H03H 9/1085 438/118 |
| 2004/0261250 A1 | 12/2004 | Kadota et al. | |
| 2005/0099091 A1 | 5/2005 | Mishima et al. | |
| 2005/0185026 A1 | 8/2005 | Noguchi et al. | |
| 2005/0218488 A1 | 10/2005 | Matsuo | |
| 2005/0264136 A1 | 12/2005 | Tsutsumi et al. | |
| 2006/0131731 A1 | 6/2006 | Sato | |
| 2006/0152107 A1 | 7/2006 | Tanaka | |
| 2006/0179642 A1 | 8/2006 | Kawamura | |
| 2006/0249824 A1* | 11/2006 | Lee | H03H 9/1078 257/678 |
| 2007/0090898 A1 | 4/2007 | Kando | |
| 2007/0115079 A1 | 5/2007 | Kubo et al. | |
| 2007/0182510 A1 | 8/2007 | Park | |
| 2007/0188047 A1 | 8/2007 | Tanaka | |
| 2007/0194863 A1 | 8/2007 | Shibata et al. | |
| 2007/0267942 A1 | 11/2007 | Matsumoto et al. | |
| 2007/0296304 A1 | 12/2007 | Fujii et al. | |
| 2008/0018414 A1 | 1/2008 | Inoue et al. | |
| 2008/0246559 A1 | 10/2008 | Ayaz | |
| 2010/0064492 A1 | 3/2010 | Tanaka | |
| 2010/0123367 A1 | 5/2010 | Tai et al. | |
| 2010/0212127 A1 | 8/2010 | Heinze et al. | |
| 2010/0301703 A1 | 12/2010 | Chen et al. | |
| 2011/0018389 A1 | 1/2011 | Fukano et al. | |
| 2011/0018654 A1 | 1/2011 | Bradley et al. | |
| 2011/0102107 A1 | 5/2011 | Onzuka | |
| 2011/0109196 A1 | 5/2011 | Goto et al. | |
| 2011/0278993 A1 | 11/2011 | Iwamoto | |
| 2012/0181898 A1* | 7/2012 | Hatakeyama | H03H 3/08 310/313 B |
| 2012/0286900 A1 | 11/2012 | Kadota et al. | |
| 2013/0057360 A1 | 3/2013 | Meltaus et al. | |
| 2013/0106535 A1* | 5/2013 | Abbott | H03H 9/25 333/195 |
| 2013/0127551 A1 | 5/2013 | Yamanaka | |
| 2013/0207747 A1 | 8/2013 | Nishii et al. | |
| 2013/0234805 A1 | 9/2013 | Takahashi | |
| 2013/0271238 A1 | 10/2013 | Onda | |
| 2013/0278609 A1 | 10/2013 | Stephanou et al. | |
| 2013/0285768 A1* | 10/2013 | Watanabe | H10N 30/01 333/193 |
| 2013/0321100 A1 | 12/2013 | Wang | |
| 2014/0009032 A1 | 1/2014 | Takahashi et al. | |
| 2014/0085020 A1* | 3/2014 | Reinhardt | H03H 3/04 333/188 |
| 2014/0113571 A1 | 4/2014 | Fujiwara et al. | |
| 2014/0130319 A1 | 5/2014 | Iwamoto | |
| 2014/0145556 A1 | 5/2014 | Kadota | |
| 2014/0151151 A1 | 6/2014 | Reinhardt | |
| 2014/0152145 A1 | 6/2014 | Kando et al. | |
| 2014/0173862 A1 | 6/2014 | Kando et al. | |
| 2014/0225684 A1 | 8/2014 | Kando et al. | |
| 2014/0312994 A1 | 10/2014 | Meltaus et al. | |
| 2015/0042417 A1 | 2/2015 | Onodera et al. | |
| 2015/0165479 A1 | 6/2015 | Lasiter et al. | |
| 2015/0244149 A1 | 8/2015 | Van Someren | |
| 2015/0319537 A1 | 11/2015 | Perois et al. | |
| 2015/0333730 A1 | 11/2015 | Meltaus et al. | |
| 2016/0028367 A1 | 1/2016 | Shealy | |
| 2016/0036415 A1 | 2/2016 | Ikeuchi | |
| 2016/0079958 A1 | 3/2016 | Burak | |
| 2016/0149554 A1 | 5/2016 | Nakagawa | |
| 2016/0182009 A1 | 6/2016 | Bhattacharjee | |
| 2016/0301382 A1 | 10/2016 | Iwamoto | |
| 2016/0380611 A1* | 12/2016 | Kai | H03H 9/02984 310/313 B |
| 2017/0063332 A1 | 3/2017 | Gilbert et al. | |
| 2017/0179225 A1 | 6/2017 | Kishimoto | |
| 2017/0179928 A1 | 6/2017 | Raihn et al. | |
| 2017/0187352 A1 | 6/2017 | Omura | |
| 2017/0201232 A1 | 7/2017 | Nakamura et al. | |
| 2017/0214381 A1 | 7/2017 | Bhattacharjee | |
| 2017/0214387 A1 | 7/2017 | Burak et al. | |
| 2017/0214389 A1 | 7/2017 | Tsutsumi | |
| 2017/0222617 A1 | 8/2017 | Mizoguchi | |
| 2017/0222622 A1 | 8/2017 | Solal et al. | |
| 2017/0249493 A1* | 8/2017 | Yu | H01L 25/16 |
| 2017/0264266 A1 | 9/2017 | Kishimoto | |
| 2017/0290160 A1 | 10/2017 | Takano et al. | |
| 2017/0317659 A1* | 11/2017 | Takeshita | H03H 9/1071 |
| 2017/0359050 A1 | 12/2017 | Irieda et al. | |
| 2017/0370791 A1 | 12/2017 | Nakamura et al. | |
| 2018/0005950 A1 | 1/2018 | Watanabe | |
| 2018/0013400 A1 | 1/2018 | Ito et al. | |
| 2018/0013405 A1 | 1/2018 | Takata | |
| 2018/0026603 A1 | 1/2018 | Iwamoto | |
| 2018/0033952 A1 | 2/2018 | Yamamoto | |
| 2018/0041191 A1 | 2/2018 | Park | |
| 2018/0062615 A1 | 3/2018 | Kato et al. | |
| 2018/0062617 A1 | 3/2018 | Yun et al. | |
| 2018/0097502 A1* | 4/2018 | Yamamoto | H03H 9/02826 |
| 2018/0102757 A1* | 4/2018 | Fukushima | H03H 9/1071 |
| 2018/0123016 A1 | 5/2018 | Gong | |
| 2018/0152169 A1 | 5/2018 | Goto et al. | |
| 2018/0191322 A1 | 7/2018 | Chang et al. | |
| 2018/0212589 A1 | 7/2018 | Meltaus et al. | |
| 2018/0278227 A1 | 9/2018 | Hurwitz | |
| 2018/0316333 A1 | 11/2018 | Nakamura et al. | |
| 2018/0358948 A1 | 12/2018 | Gong et al. | |
| 2018/0358950 A1* | 12/2018 | Yamamoto | H03H 9/1071 |
| 2019/0007022 A1 | 1/2019 | Goto et al. | |
| 2019/0068155 A1 | 2/2019 | Kimura et al. | |
| 2019/0068164 A1 | 2/2019 | Houlden et al. | |
| 2019/0123721 A1 | 4/2019 | Takamine | |
| 2019/0131953 A1 | 5/2019 | Gong | |
| 2019/0148621 A1 | 5/2019 | Feldman et al. | |
| 2019/0181833 A1 | 6/2019 | Nosaka | |
| 2019/0207583 A1 | 7/2019 | Miura et al. | |
| 2019/0245518 A1 | 8/2019 | Ito | |
| 2019/0273480 A1* | 9/2019 | Lin | H03H 9/725 |
| 2019/0333965 A1* | 10/2019 | Campanella-Pineda | H01L 21/0254 |
| 2019/0346407 A1* | 11/2019 | Campanella-Pineda | G01N 29/036 |
| 2019/0348966 A1 | 11/2019 | Campanella-Pineda | |
| 2019/0379351 A1 | 12/2019 | Miyamoto et al. | |
| 2019/0386636 A1 | 12/2019 | Plesski et al. | |
| 2020/0007110 A1 | 1/2020 | Konaka et al. | |
| 2020/0021272 A1 | 1/2020 | Segovia Fernandez et al. | |
| 2020/0036357 A1 | 1/2020 | Mimura | |
| 2020/0235719 A1 | 7/2020 | Yantchev et al. | |
| 2020/0259480 A1 | 8/2020 | Pensala | |
| 2020/0295729 A1 | 9/2020 | Yantchev | |
| 2020/0304091 A1 | 9/2020 | Yantchev | |
| 2020/0313645 A1 | 10/2020 | Caron | |
| 2020/0321939 A1 | 10/2020 | Turner et al. | |
| 2020/0328728 A1 | 10/2020 | Nakagawa et al. | |
| 2020/0350891 A1 | 11/2020 | Turner | |
| 2020/0373907 A1 | 11/2020 | Garcia | |
| 2021/0013859 A1 | 1/2021 | Turner et al. | |
| 2021/0273631 A1 | 9/2021 | Jachowski et al. | |
| 2021/0313951 A1 | 10/2021 | Yandrapalli et al. | |
| 2021/0328574 A1 | 10/2021 | Garcia | |
| 2021/0328575 A1 | 10/2021 | Hammond et al. | |
| 2022/0103160 A1 | 3/2022 | Jachowski et al. | |
| 2022/0116014 A1 | 4/2022 | Poirel | |
| 2022/0116015 A1 | 4/2022 | Garcia et al. | |
| 2022/0123720 A1 | 4/2022 | Garcia et al. | |
| 2022/0123723 A1 | 4/2022 | Garcia et al. | |
| 2022/0149808 A1 | 5/2022 | Dyer et al. | |
| 2022/0149814 A1 | 5/2022 | Garcia et al. | |

FOREIGN PATENT DOCUMENTS

| | | |
|---|---|---|
| JP | 2001244785 A | 9/2001 |
| JP | 2002300003 A | 10/2002 |
| JP | 2003078389 A | 3/2003 |
| JP | 2004096677 A | 3/2004 |

(56) References Cited

FOREIGN PATENT DOCUMENTS

| | | | | |
|---|---|---|---|---|
| JP | 2004129222 A | 4/2004 | | |
| JP | 2004523179 A | 7/2004 | | |
| JP | 2004304622 A | 10/2004 | | |
| JP | 2006173557 A | 6/2006 | | |
| JP | 2007251910 A | 9/2007 | | |
| JP | 2007329584 A | 12/2007 | | |
| JP | 2010062816 A | 3/2010 | | |
| JP | 2010103803 A | 5/2010 | | |
| JP | 2010154505 A | 7/2010 | | |
| JP | 2010-233210 A | 10/2010 | | |
| JP | 2013528996 A | 7/2013 | | |
| JP | 2013214954 A | 10/2013 | | |
| JP | 2015-054986 A | 3/2015 | | |
| JP | 2016-001923 A | 1/2016 | | |
| JP | 2017526254 A | 9/2017 | | |
| JP | 2017220910 A | 12/2017 | | |
| JP | 2018093487 A | 6/2018 | | |
| JP | 2018166259 A | 10/2018 | | |
| JP | 2018207144 A | 12/2018 | | |
| JP | 2019186655 A | 10/2019 | | |
| JP | 2020113939 A | 7/2020 | | |
| WO | 2010047114 A1 | 4/2010 | | |
| WO | 2013021948 A1 | 2/2013 | | |
| WO | 2015098694 A1 | 7/2015 | | |
| WO | 2016017104 | 2/2016 | | |
| WO | 2016052129 A1 | 4/2016 | | |
| WO | 2016/147687 A1 | 9/2016 | | |
| WO | WO-2016208428 A1 * | 12/2016 | ......... | H03H 9/02574 |
| WO | 2017188342 A1 | 11/2017 | | |
| WO | 2018003268 A1 | 1/2018 | | |
| WO | 2018003273 | 1/2018 | | |
| WO | 2018163860 A1 | 9/2018 | | |
| WO | 2019117133 A1 | 6/2019 | | |
| WO | 2019138810 A1 | 7/2019 | | |
| WO | 2020092414 A2 | 5/2020 | | |
| WO | 2020100744 A1 | 5/2020 | | |

OTHER PUBLICATIONS

Sorokin et al. Study of Microwave Acoustic Attenuation in a Multi-frequency Bulk Acoustic Resonator Based on a Synthetic Diamond Single Crystal Published in Acoustical Physics, vol. 61, No. 6, 2015 pp. 675 (Year 2015) Jan. 2015.

Zou, Jie "High-Performance Aluminum Nitride Lamb Wave Resonators for RF Front-End Technology" University of California, Berkeley, Summer 2015, pp. 63 (Year 2015) Jan. 2015.

Santosh, G. , Surface acoustic wave devices on silicon using patterned and thin film ZnO, Ph.D. thesis, Feb. 2016, Indian Institute of technology Guwahati, Assam, India Feb. 2016.

Merriam Webster, dictionary meaning of the word "diaphragm", since 1828, Merriam Webster (Year: 1828) 1828.

Kadota et al. "5.4 Ghz Lamb Wave Resonator on LiNbO3 Thin Crystal Plate and Its Application," published in Japanese Journal of Applied Physics 50 (2011) 07HD11. (Year: 2011) 2011.

Safari et al. "Piezoelectric for Transducer Applications" published by Elsevier Science Ltd., pp. 4 (Year: 2000). 2020.

Moussa et al. Review on Triggered Liposomal Drug Delivery with a Focus on Ultrasound 2015, Bentham Science Publishers, pp. 16 (Year 2005) 2005.

Acoustic Properties of Solids ONDA Corporation 592 Weddell Drive, Sunnyvale, CA 94089, Apr. 11, 2003, pp. 5 (Year 2003). 2003.

Bahreyni, B. Fabrication and Design of Resonant Microdevices Andrew William, Inc. 2018, NY (Year 2008). 2008.

Material Properties of Tibtech Innovations, © 2018 TIBTECH Innovations (Year 2018). 2018.

USPTO/ISA, International Search Report and Written Opinion for PCT Application No. PCT/US2020/45654 dated Oct. 29, 2020.

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Y. Yang, A. Gao et al. "5 GHZ Lithium Niobate MEMS Resonators With High FOM of 153", 2017 IEEE 30th International Conference in Micro Electro Mechanical Systems (MEMS). Jan. 22-26, 2017. pp. 942-945.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

G. Manohar, "Investigation of Various Surface Acoustic Wave Design Configurations for Improved Sensitivity." Doctoral dissertation, University of South Florida, USA, Jan. 2012, 7 pages.

Ekeom, D. & Dubus, Bertrand & Volatier, A . . . (2006). Solidly mounted resonator (SMR) FEM-BEM simulation. 1474-1477. 10.1109/ULTSYM.2006.371.

Mizutaui, K. and Toda, K., "Analysis of lamb wave propagation characteristics in rotated Ycut Xpropagation LiNbO3 plates." Electron. Comm. Jpn. Pt. I, 69, No. 4 (1986): 47-55. doi:10.1002/ecja.4410690406.

Naumenko et al., "Optimal orientations of Lithium Niobate for resonator SAW filters", 2003 IEEE Ultrasonics Symposium—pp. 2110-2113. (Year: 2003).

Namdeo et al. "Simulation on Effects of Electrical Loading due to Interdigital Transducers in Surface Acoustic Wave Resonator", published in Procedia Engineering 64 ( 2013) of Science Direct pp. 322-330 (Year: 2013) 2013.

Rodriguez-Madrid et al., "Super-High-Frequency SAW Resonators on AlN/Diamond", IEEE Electron Device Letters, vol. 33, No. 4, Apr. 2012, pp. 495-497. Year: 2012) 2012.

A. C. Guyette, "Theory and Design of Intrinsically Switched Multiplexers With Optimum Phase Linearity," in IEEE Transactions on Microwave Theory and Techniques, vol. 61, No. 9, pp. 3254-3264, Sep. 2013, doi: 10.1109/TMTT.2013.2274963. Sep. 2013.

Yanson Yang, Ruochen Lu, Songbin Gong, High Q Antisymmetric Mode Lithium Niobate MEMS Resonators With Spurious Mitigation, Journal of Microelectromechanical Systems, vol. 29, No. 2, Apr. 2020. Apr. 2, 2020.

Yu-Po Wong, Luyan Qiu, Naoto Matsuoka, Ken-ya Hashimoto, Broadband Piston Mode Operation for First-order Antisymmetric Mode Resonators, 2020 IEEE International Ultrasonics Symposium, Sep. 2020. Sep. 2020.

USPTO/ISA, International Search Report and Written Opinion for PCT Application No. PCT/US2021/024824 dated Jul. 27, 2021, 9 total pages.

Chen et al., "Development and Application of SAW Filter," Micromachines, Apr. 20, 2022, vol. 13, No. 656, pp. 1-15.

Herrmann et al., "Properties of shear-horizontal surface acoustic waves in different layered quartz-SiO2 structures," Ultrasonics, 1999, vol. 37, pp. 335-341.

Lam et al., "A Review of Lame and Lamb Mode Crystal Resonators for Timing Applications and Prospects of Lame and Lamb Mode Piezo MEMS Resonators for Filtering Applications," 2018 International Symposium on Acoustic Wave Devices for Future Mobile Communication Systems, Mar. 6-7, 2018, 12 pages.

* cited by examiner

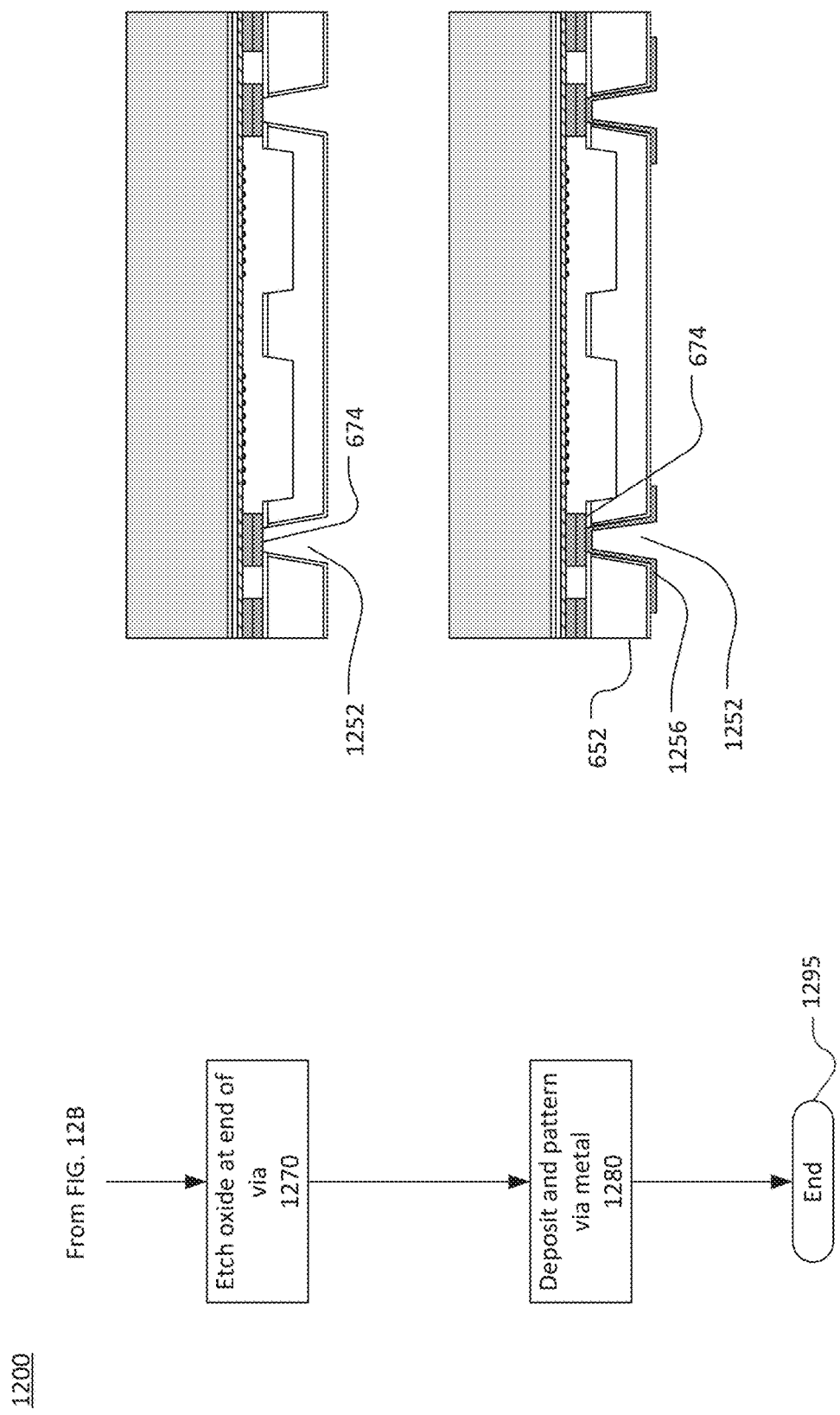

SOLIDLY-MOUNTED TRANSVERSELY-EXCITED FILM BULK ACOUSTIC DEVICE

RELATED APPLICATION INFORMATION

This patent is a continuation-in-part of co-pending application Ser. No. 17/361,046, filed Jun. 28, 2021, titled SOLIDLY-MOUNTED TRANSVERSELY-EXCITED FILM BULK ACOUSTIC RESONATOR, which is a continuation of application Ser. No. 16/779,306, filed Jan. 31, 2020, titled SOLIDLY-MOUNTED TRANSVERSELY-EXCITED FILM BULK ACOUSTIC RESONATOR, now U.S. Pat. No. 11,165,407, which is a continuation of application Ser. No. 16/438,141, filed Jun. 11, 2019, titled SOLIDLY-MOUNTED TRANSVERSELY-EXCITED FILM BULK ACOUSTIC RESONATOR, now U.S. Pat. No. 10,601,392, which claims priority from provisional patent application 62/753,809, filed Oct. 31, 2018, titled SOLIDLY MOUNTED SHEAR-MODE FILM BULK ACOUSTIC RESONATOR, and provisional patent application 62/818,564, filed Mar. 14, 2019, titled SOLIDLY MOUNTED XBAR. Application Ser. No. 16/438,141 is a continuation-in-part of application Ser. No. 16/230,443, filed Dec. 21, 2018, titled TRANSVERSELY-EXCITED FILM BULK ACOUSTIC RESONATOR, now U.S. Pat. No. 10,491,192, which claims priority from the following provisional applications: application 62/685,825, filed Jun. 15, 2018, entitled SHEAR-MODE FBAR (XBAR); application 62/701,363, filed Jul. 20, 2018, entitled SHEAR-MODE FBAR (XBAR); application 62/741,702, filed Oct. 5, 2018, entitled 5 GHZ LATERALLY-EXCITED BULK WAVE RESONATOR (XBAR); application 62/748,883, filed Oct. 22, 2018, entitled SHEAR-MODE FILM BULK ACOUSTIC RESONATOR; and application 62/753,815, filed Oct. 31, 2018, entitled LITHIUM TANTALATE SHEAR-MODE FILM BULK ACOUSTIC RESONATOR. All of these applications are incorporated herein by reference.

This patent is also a continuation-in-part of co-pending U.S. application Ser. No. 16/998,300, titled TRANSVERSELY-EXCITED FILM BULK ACOUSTIC RESONATOR, filed Aug. 20, 2020, which is a division of application Ser. No. 16/841,134 titled TRANSVERSELY-EXCITED FILM BULK ACOUSTIC RESONATOR PACKAGE AND METHOD, filed Apr. 6, 2020, now U.S. Pat. No. 10,819,309, which claims priority to the following provisional patent applications: application 62/830,258, titled XBAR PACKAGING, filed Apr. 5, 2019; application 62/881,749, titled XBAR PACKAGING INCLUDING CAP PLATE, filed Aug. 1, 2019; and application 62/904,416, titled XBAR WAFER-LEVEL PACKAGING, filed Sep. 23, 2019, all of which are incorporated herein by reference in their entirety.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a pass-band or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the insertion loss of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

The desire for wider communication channel bandwidths will inevitably lead to the use of higher frequency communications bands. The current LTE™ (Long Term Evolution) specification defines frequency bands from 3.3 GHz to 5.9 GHz. Some of these bands are not presently used. Future proposals for wireless communications include millimeter wave communication bands with frequencies up to 28 GHz.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators.

However, these existing technologies are not well-suited for use at the higher frequencies proposed for future communications networks.

DESCRIPTION OF THE DRAWINGS

FIG. 12A, FIG. 12B, and FIG. 12C are, in combination, a flow chart of process for packaging an SM XBAR filter.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
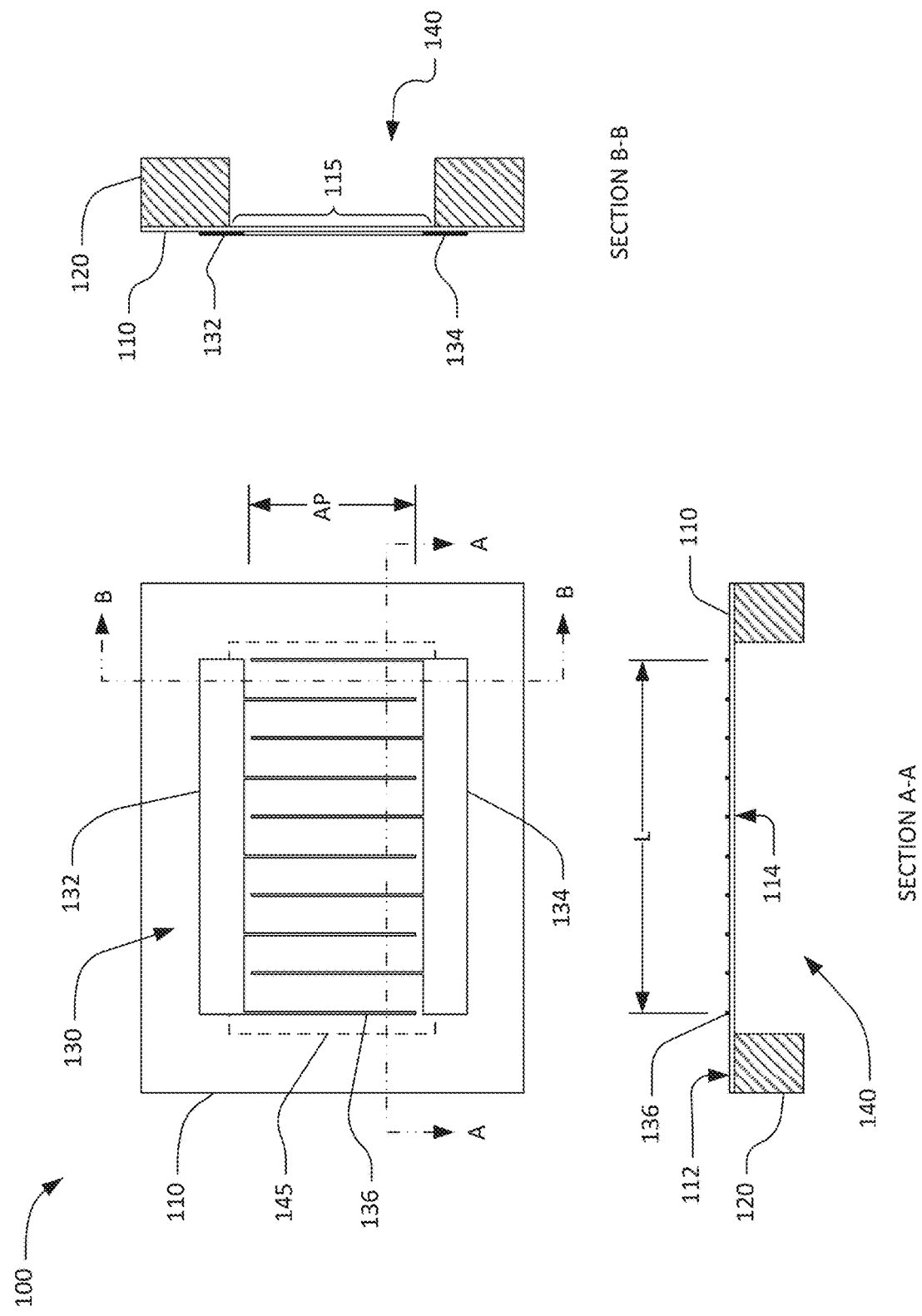
FIG. 1 includes a schematic plan view and schematic cross-sectional views of a transversely-excited film bulk acoustic resonator (XBAR).

FIG. 1 shows a simplified schematic top view and orthogonal cross-sectional views of a transversely-excited film bulk acoustic resonator (XBAR) 100 as described in application Ser. No. 16/230,443, TRANSVERSELY-EXCITED FILM BULK ACOUSTIC RESONATOR. XBAR resonators such as the resonator 100 may be used in a variety of RF filters including band-reject filters, band-pass filters, duplexers, and multiplexers. XBARs are particularly suited for use in filters for communications bands with frequencies above 3 GHz.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. XBARs may be fabricated on piezoelectric plates with various crystallographic orientations including Z-cut, rotated Z-cut, and rotated YX-cut.

The back surface 114 of the piezoelectric plate 110 is attached to a substrate 120 that provides mechanical support to the piezoelectric plate 110. The substrate 120 may be, for example, silicon, sapphire, quartz, or some other material. The piezoelectric plate 110 may be bonded to the substrate 120 using a wafer bonding process, or grown on the substrate 120, or attached to the substrate in some other manner. The piezoelectric plate may be attached directly to the substrate or may be attached to the substrate via one or more intermediate material layers.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The first and second busbars 132, 134 serve as the terminals of the XBAR 100. A radio frequency or microwave signal applied between the two busbars 132, 134 of the IDT 130 excites an acoustic wave within the piezoelectric plate 110. As will be discussed in further detail, the excited acoustic wave is a bulk shear wave that propagates in a direction substantially normal to the surface of the piezoelectric plate 110, which is also normal, or transverse, to the direction of the electric field created by the IDT fingers. Thus, the XBAR is considered a transversely-excited film bulk wave resonator.

A cavity 140 is formed in the substrate 120 such that the portion 115 of the piezoelectric plate 110 containing the IDT 130 is suspended over the cavity 140 without contacting the substrate 120. "Cavity" has its conventional meaning of "an empty space within a solid body." The cavity 140 may be a hole completely through the substrate 120 (as shown in Section A-A and Section B-B) or a recess in the substrate 120. The cavity 140 may be formed, for example, by selective etching of the substrate 120 before or after the piezoelectric plate 110 and the substrate 120 are attached. As shown in FIG. 1, the cavity 145 has a rectangular perimeter 145 with an extent greater than the aperture AP and length L of the IDT 130. The perimeter of the cavity of an XBAR may have a different shape, such as a regular or irregular polygon. The cavity of an XBAR may more or fewer than four sides, which may be straight or curved.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 110. An XBAR may have hundreds, possibly thousands, of parallel fingers in the IDT 110. Similarly, the thickness of the fingers in the cross-sectional views is greatly exaggerated.

Figure 2:
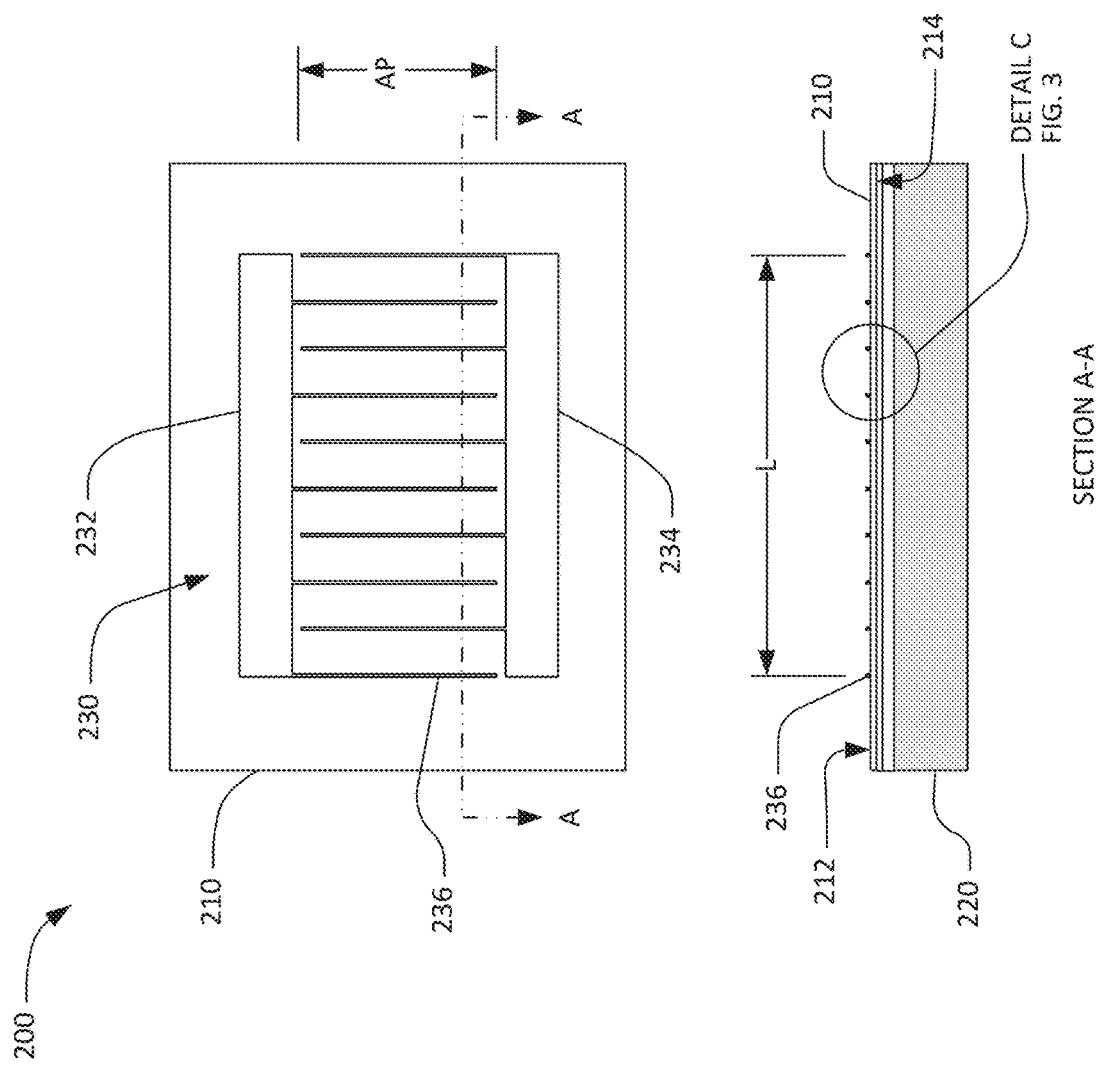
FIG. 2 includes a schematic plan view and a schematic cross-sectional view of a solidly-mounted transversely-excited film bulk acoustic resonator (SM XBAR).

FIG. 2 shows a simplified schematic top view and an orthogonal cross-sectional view of a solidly-mounted transversely-excited film bulk acoustic resonator (SM XBAR) 200. SM XBAR resonators such as the resonator 200 may be used in a variety of RF filters including band-reject filters, band-pass filters, duplexers, and multiplexers. SM XBARs are particularly suited for use in filters for communications bands with frequencies above 3 GHz.

The SM XBAR 200 is made up of a thin film conductor pattern formed on a front surface 212 of a piezoelectric plate 210 having parallel front and back surfaces 212, 214, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. SM XBARs may be fabricated on piezoelectric plates with various crystallographic orientations as previously described.

The back surface 214 of the piezoelectric plate 210 is attached to, and mechanically supported by, a substrate 220. The substrate 220 may be, for example, silicon, sapphire, quartz, or some other material. As will be described subsequently, the piezoelectric plate 210 may be attached to the substrate 220 via a plurality of intermediate material layers.

The conductor pattern of the SM XBAR 200 includes an interdigital transducer (IDT) 230. The IDT 230 includes a first plurality of parallel fingers, such as finger 236, extending from a first busbar 232 and a second plurality of fingers extending from a second busbar 234. The first and second pluralities of parallel fingers are interleaved. The interleaved fingers overlap for a distance AP, commonly referred to as the "aperture" of the IDT. The center-to-center distance L between the outermost fingers of the IDT 230 is the "length" of the IDT.

The first and second busbars 232, 234 serve as the terminals of the SM XBAR 200. A radio frequency or microwave signal applied between the two busbars 232, 234 of the IDT 230 excites an acoustic wave within the piezoelectric plate 210. As will be discussed in further detail, the primary excited acoustic wave is a bulk shear wave that propagates in a direction substantially normal to the surface of the piezoelectric plate 210, which is also normal, or transverse, to the direction of the electric field created by the IDT fingers. Thus, the SM XBAR is considered a transversely-excited film bulk wave resonator.

For ease of presentation in FIG. 2, the geometric pitch and width of the IDT fingers are greatly exaggerated with respect to the length (dimension L) and aperture (dimension AP) of the SM XBAR. A typical SM XBAR has more than ten parallel fingers in the IDT 210. An SM XBAR may have hundreds, possibly thousands, of parallel fingers in the IDT 210. Similarly, the thickness of the fingers in the cross-sectional views is greatly exaggerated.

Figure 3:
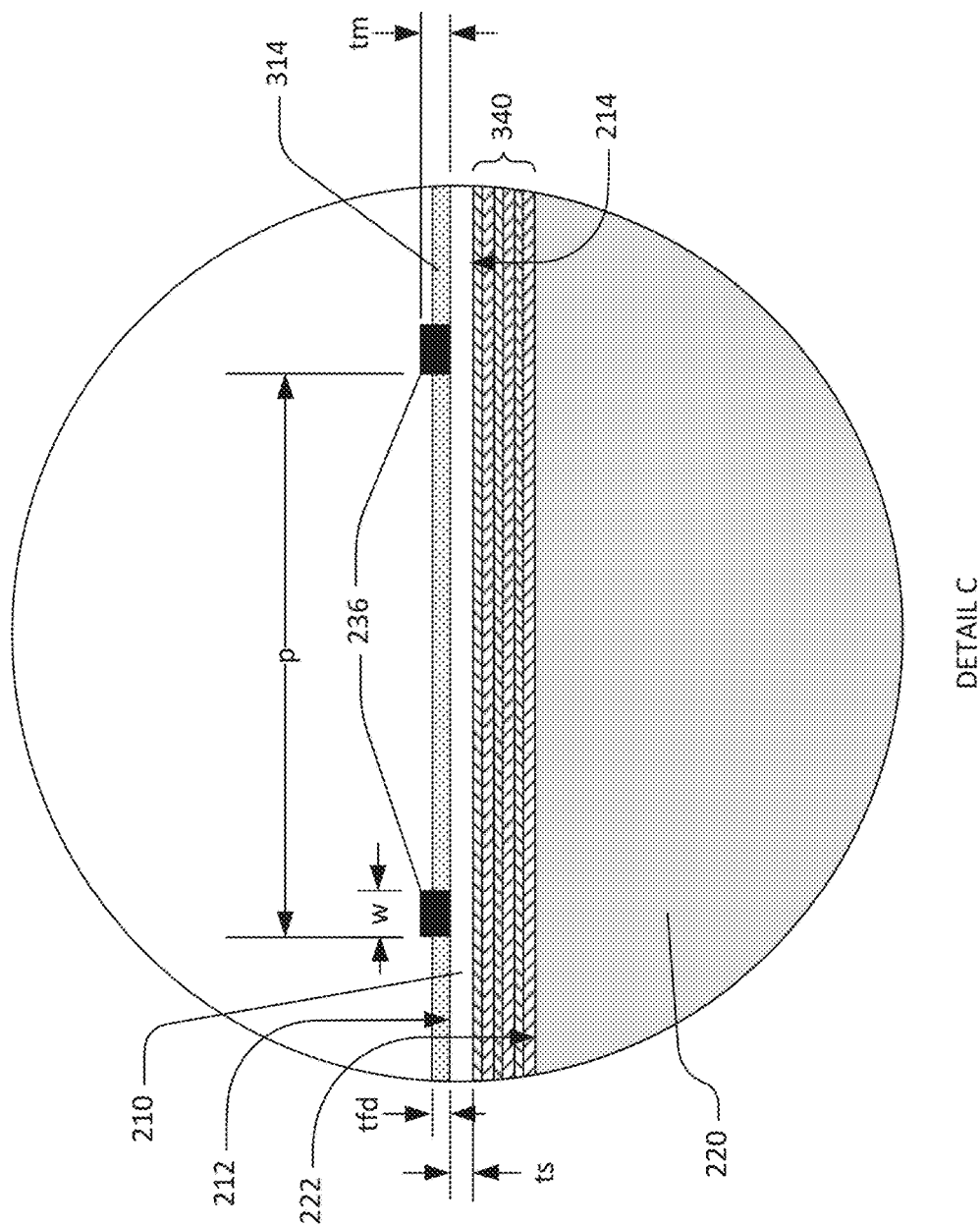
FIG. 3 is an expanded schematic cross-sectional view of a portion of the SM XBAR of FIG. 2.

FIG. 3 shows a detailed schematic cross-sectional view of the SM XBAR 200. The piezoelectric plate 210 is a single-crystal layer of piezoelectrical material having a thickness ts. ts may be, for example, 100 nm to 1500 nm. When used in filters for LTE™ bands from 3.4 GHZ to 6 GHz (e.g. bands 42, 43, 46), the thickness ts may be, for example, 200 nm to 500 nm.

A front-side dielectric layer 314 may optionally be formed on the front surface 212 of the piezoelectric plate 210. The front-side dielectric layer 314 has a thickness tfd. The front-side dielectric layer 314 may be formed between the IDT fingers 236. Although not shown in FIG. 2, the front side dielectric layer 314 may also be deposited over the IDT fingers 236. The front-side dielectric layer 314 may be a non-piezoelectric dielectric material, such as silicon dioxide or silicon nitride. tfd may be, for example, 0 to 500 nm.

The IDT fingers 238 may be aluminum or a substantially aluminum alloy, copper or a substantially copper alloy, beryllium, gold, molybdenum, or some other conductive material. Thin (relative to the total thickness of the conductors) layers of other metals, such as chromium or titanium, may be formed under and/or over the fingers to improve adhesion between the fingers and the piezoelectric plate 210 and/or to passivate or encapsulate the fingers. The busbars (232, 234 in FIG. 2) of the IDT may be made of the same or different materials as the fingers.

Dimension p is the center-to-center spacing or "pitch" of the IDT fingers, which may be referred to as the pitch of the IDT and/or the pitch of the SM XBAR. Dimension w is the width or "mark" of the IDT fingers. The IDT of an SM XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e. the mark or finger width w is about one-fourth of the acoustic wavelength at resonance). In an SM XBAR, the pitch p of the IDT is typically 2 to 20 times the width w of the fingers. In addition, the pitch p of the IDT is typically 2 to 20 times the thickness is of the piezoelectric slab 212. The width of the IDT fingers in an SM XBAR is not constrained to one-fourth of the acoustic wavelength at resonance. For example, the width of SM XBAR IDT fingers may be 500 nm or greater, such that the IDT can be fabricated using optical lithography. The thickness tm of the IDT fingers may be from 100 nm to about equal to the width w. The thickness of the busbars (132, 134 in FIG. 1) of the IDT may be the same as, or greater than, the thickness tm of the IDT fingers.

An acoustic Bragg reflector 340 is sandwiched between a surface 222 of the substrate 220 and the back surface 214 of the piezoelectric plate 110. The term "sandwiched" means the acoustic Bragg reflector 340 is both disposed between and physically connected to a surface 222 of the substrate 220 and the back surface 214 of the piezoelectric plate 210. In some circumstances, thin layers of additional materials may be disposed between the acoustic Bragg reflector 340 and the surface 222 of the substrate 220 and/or between the Bragg reflector 340 and the back surface 214 of the piezoelectric plate 210. Such additional material layers may be present, for example, to facilitate bonding the piezoelectric plate 210, the acoustic Bragg reflector 340, and the substrate 220.

The acoustic Bragg reflector 340 includes multiple layers that alternate between materials having high acoustic impedance and materials have low acoustic impedance. "High" and "low" are relative terms. For each layer, the standard for comparison is the adjacent layers. Each "high" acoustic impedance layer has an acoustic impedance higher than that of both the adjacent low acoustic impedance layers. Each "low" acoustic impedance layer has an acoustic impedance lower than that of both the adjacent high acoustic impedance layers. Each of the layers has a thickness equal to, or about, one-fourth of the acoustic wavelength at or near a resonance frequency of the SM XBAR 200. Materials having comparatively low acoustic impedance include silicon dioxide, silicon oxycarbide, aluminum, and certain plastics such as cross-linked polyphenylene polymers. Materials having comparatively high acoustic impedance include silicon nitride, aluminum nitride, hafnium oxide, silicon carbide, diamond, diamond-like carbon, and metals such as molybdenum, tungsten, gold, and platinum. All of the high acoustic impedance layers of the acoustic Bragg reflector 340 are not necessarily the same material, and all of the low acoustic impedance layers are not necessarily the same material. In the example of FIG. 2, the acoustic Bragg reflector 340 has a total of six layers. An acoustic Bragg reflector may have more than, or less than, six layers.

Figure 4:
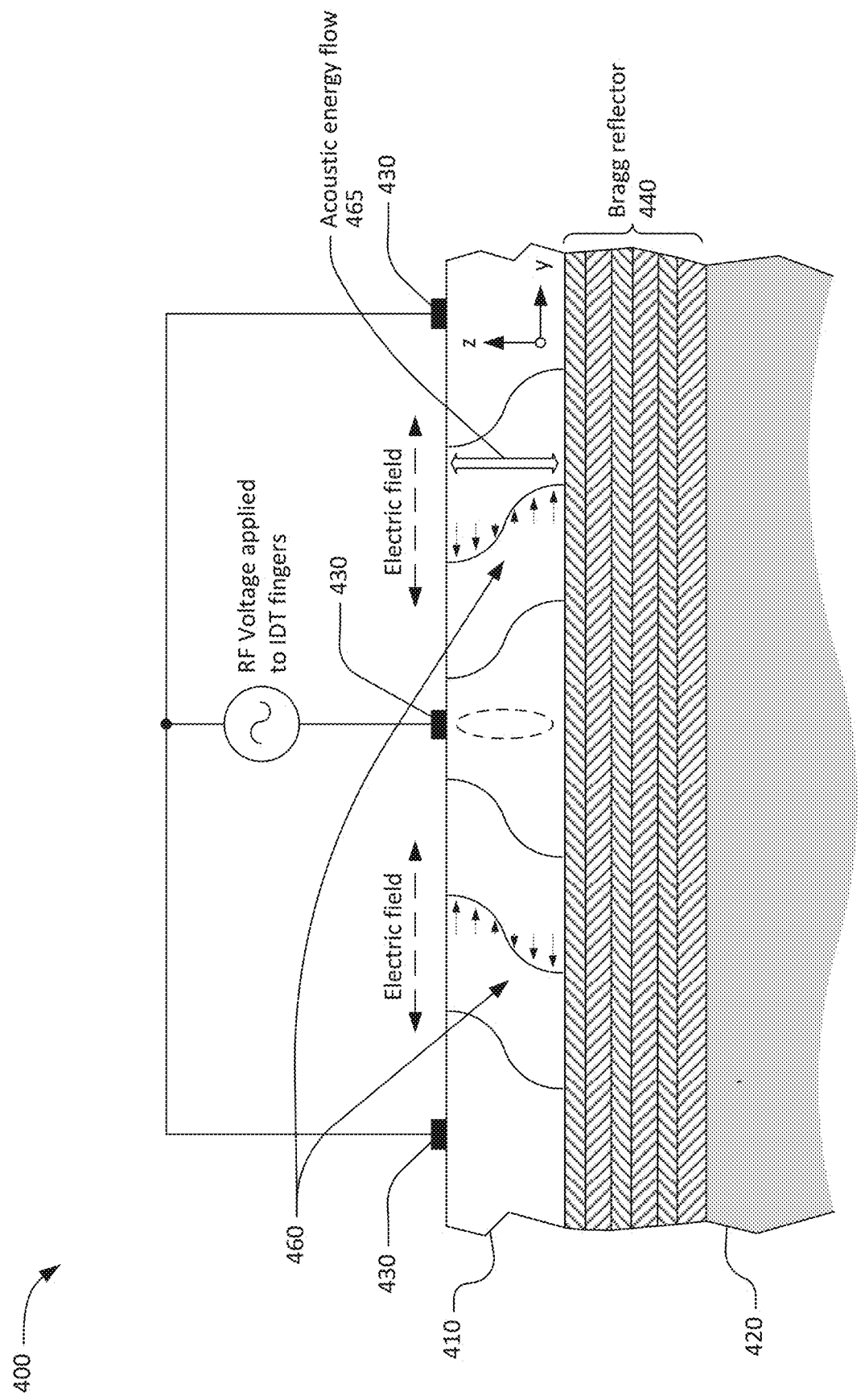
FIG. 4 is a graphic illustrating a shear acoustic mode in an SM XBAR.

FIG. 4 is a graphical illustration of the primary acoustic mode in a SM XBAR 400. FIG. 4 shows a small portion of the SM XBAR 400 including a piezoelectric plate 410 and three interleaved IDT fingers 430. For example, the piezoelectric plate 410 may be single-crystal lithium niobate cut such that the z-axis is normal to the surfaces of the plate. The IDT fingers may be oriented parallel to the x-axis of the plate such that the y-axis is normal to the fingers.

An RF voltage applied to the interleaved fingers 430 creates a time-varying electric field between the fingers. The direction of the electric field is lateral, or parallel to the surface of the piezoelectric plate 410, and orthogonal to the length of the IDT fingers, as indicated by the dashed arrows labeled "electric field". Due to the high dielectric constant of the piezoelectric plate, the electric field is highly concentrated in the plate relative to the air. The lateral electric field introduces shear deformation, and thus strongly excites shear-mode acoustic waves, in the piezoelectric plate 410. In this context, "shear deformation" is defined as deformation in which parallel planes in a material remain parallel and maintain a constant distance while translating relative to each other. "Shear acoustic waves" are defined as acoustic waves in a medium that result in shear deformation of the medium. The shear deformations in the piezoelectric plate 410 are represented by the curves 460, with the adjacent small arrows providing a schematic indication of the direction and magnitude of atomic motion. The degree of atomic motion, as well as the thickness of the piezoelectric plate 410, have been greatly exaggerated for ease of visualization. While the atomic motions are predominantly lateral (i.e. horizontal as shown in FIG. 4), the direction of acoustic energy flow of the primary shear acoustic mode is substantially orthogonal to the surface of the piezoelectric plate, as indicated by the arrow 465.

An acoustic Bragg reflector 440 is sandwiched between the piezoelectric plate 410 and a substrate 420. The acoustic Bragg reflector 440 reflects the shear acoustic waves to keep the acoustic energy (arrow 465) predominantly confined to the piezoelectric plate 410. As previously described, the acoustic Bragg reflector 440 consists of alternating layers of materials having relatively high and relatively low acoustic impedance, with each layer having a thickness of about one-quarter of the wavelength of the shear acoustic waves (arrow 465) at resonance frequency of the SM XBAR 400. In the example of FIG. 4, the acoustic Bragg reflector 440 has a total of six layers. An acoustic Bragg reflector may have more than, or less than, six layers. The acoustic Bragg reflector 440 may be configured (e.g. by selecting the materials and number of layers) to reflect the primary shear acoustic mode over a frequency range including a resonance frequency and an anti-resonance frequency of the SM XBAR 400.

Figure 5:
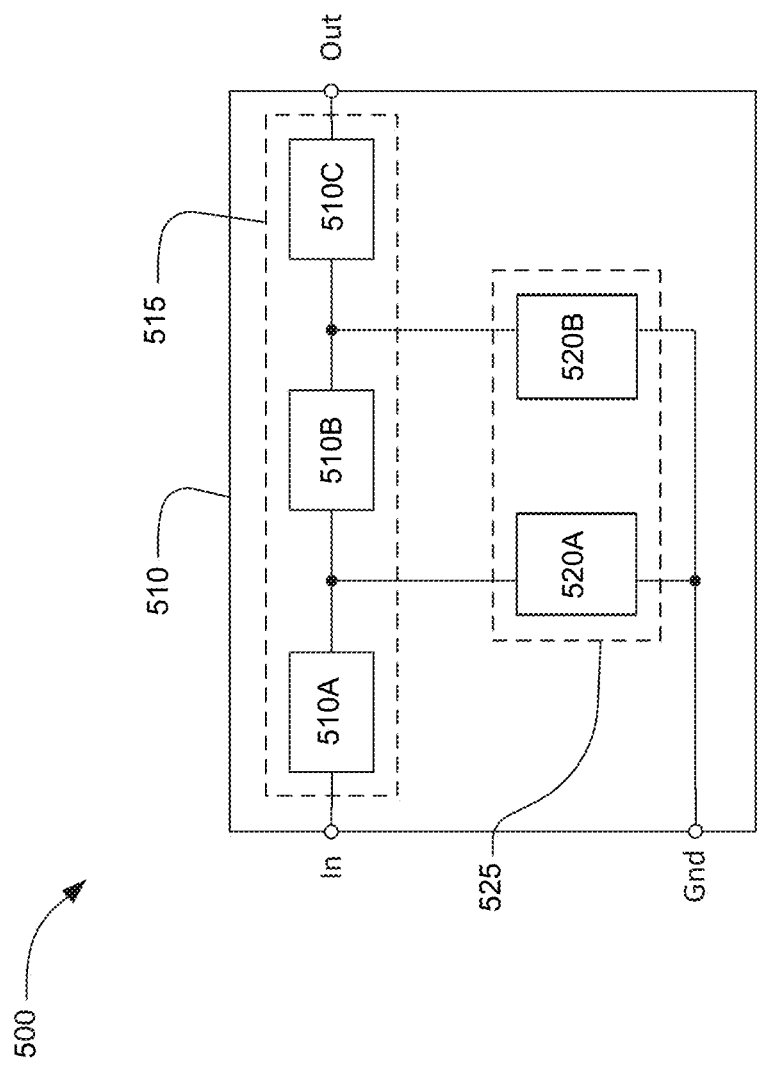
FIG. 5 is a block diagram of a filter including five SM XBARs.

FIG. 5 is a schematic circuit diagram for a high frequency band-pass filter 500 using SM XBARs. The filter 500 has a conventional ladder filter architecture including three series resonators 510A, 510B, 510C and two shunt resonators 520A, 520B. The three series resonators 510A, 510B, and 510C are connected in series between a first port and a second port. In FIG. 5, the first and second ports are labeled "In" and "Out", respectively. However, the filter 500 is symmetrical and either port may serve as the input or output of the filter. The two shunt resonators 520A, 520B are connected from nodes between the series resonators to ground. All the shunt resonators and series resonators are SM XBARs.

The filter 500 may include a substrate having a surface, a single-crystal piezoelectric plate having parallel front and back surfaces, and an acoustic Bragg reflector sandwiched between the surface of the substrate and the back surface of the single-crystal piezoelectric plate. The substrate, acoustic Bragg reflector, and single-crystal plates are represented by the rectangle 510 in FIG. 5. A conductor pattern formed on the front surface of the single-crystal piezoelectric plate includes interdigital transducers (IDTs) for each of the three series resonators 510A, 510B, 510C and two shunt resonators 520A, 520B. All of the IDTs are configured to excite shear acoustic waves in the single-crystal piezoelectric plate in response to respective radio frequency signals applied to each IDT.

In a ladder filter, such as the filter 500, the resonance frequencies of shunt resonators are typically lower than the resonance frequencies of series resonators. The resonance frequency of an SM XBAR resonator is determined, in small part, by IDT pitch. IDT pitch also impacts other filter parameters including impedance and power handling capability. For broad-band filter applications, it not be practical to provide the required difference between the resonance frequencies of shunt and series resonators using only differences in IDT pitch.

To reduce the resonance frequencies of some or all of the shunt resonators relative to the series resonators, a first dielectric layer (represented by the dashed rectangle 525) having a first thickness t1 may be deposited over the IDTs of one or both of the shunt resonators 520A, 520B. A second dielectric layer (represented by the dashed rectangle 515) having a second thickness t2, less than t1, may be deposited over the IDTs of the series resonators 510A, 510B, 510C. The thickness of each of the first and second dielectric layers may be between 0 and 300 nm, such that $0 \le t2 < t1 \le 300$ nm. The use of two different dielectric layer thicknesses may be appropriate in situations where a shift of at least 100 MHz is required between the resonance frequencies of series and shunt resonators. When the dielectric layers are silicon dioxide, $t1-t2 \ge 25$ nm is sufficient to cause a shift of at least 100 MHz between the resonance frequencies of series and shunt resonators.

Figure 6:
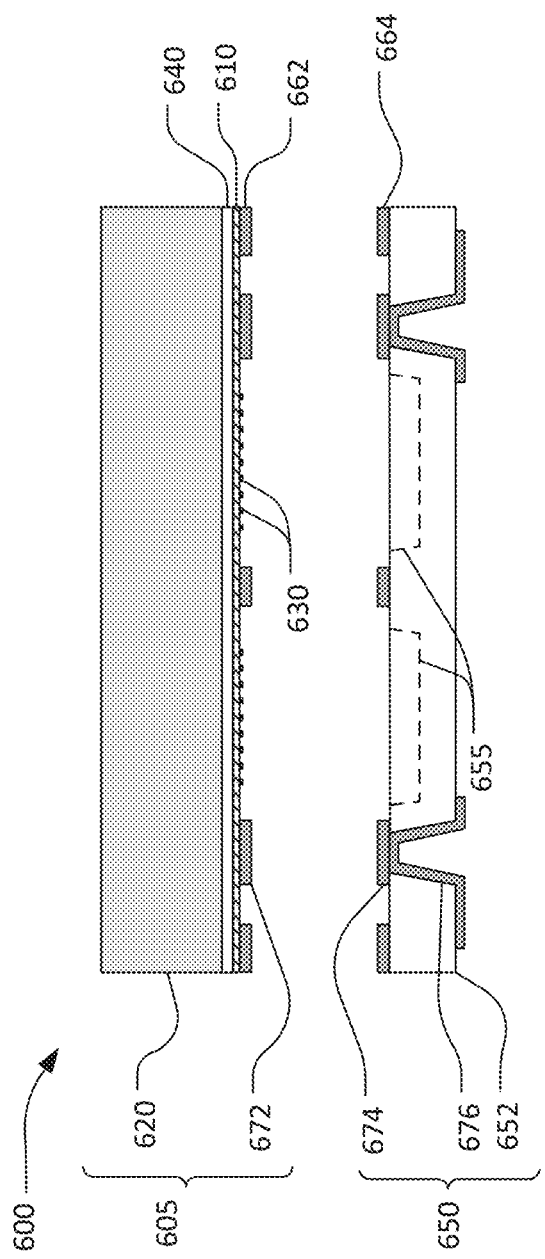
FIG. 6 is a schematic cross-sectional view of an SM XBAR filter chip and an interposer prior to bonding.

FIG. 6 is an exploded schematic cross-sectional view of a packaged SM XBAR filter 600. More specifically, FIG. 6 shows schematic cross-sectional views of an SM XBAR filter chip 605 and an interposer 650 prior to bonding.

The SM XBAR filter chip 605 includes a piezoelectric plate 610 attached to a substrate 620 with an acoustic Bragg reflector 640 sandwiched between the piezoelectric plate 610 and the substrate 620. The piezoelectric plate 610 may be lithium niobate, lithium tantalate, or some other material. The substrate 620 may be silicon or some other material. A first conductor pattern is formed on the surface of the piezoelectric plate 610. The first conductor pattern has a first level that includes IDTs with interleaved IDT fingers, such as fingers 630. The first level of the first conductor pattern may be aluminum, copper, molybdenum, or some other metal with a thickness of about 100 nm to 1000 nm.

The first conductor pattern includes a second level formed on the surface of the piezoelectric plate 610. The second level, which may overlay portions of the first level, may be gold, aluminum, copper or some other metal. The second level includes a continuous conductor 662 around the perimeter of the SM XBAR filter chip 605. The second level also includes contact pads, such as contact pad 672, in locations where portions of the first conductor pattern must be connected to circuitry external to the packaged SM XBAR filter.

The interposer 650 includes a base 652, which may be high resistivity silicon or some other material. The base 652 may have recesses 655 so that the surfaces of the base 652 facing the IDT fingers 630 on the SM XBAR filter chip 605 (i.e. the bottoms of the recesses 655) are sufficiently far from the IDT fingers. A second conductor pattern is formed on the surface of the base 652 facing the SM XBAR filter chip 605. The second conductor pattern may be the same material as the second level of the first conductor pattern. The second conductor pattern includes a continuous conductor 664 around the perimeter of the base 652. The second conductor pattern also includes contact pads, such as contact pad 674, in locations where portions of the first conductor pattern must be connected to circuitry external to the packaged SM XBAR filter. The arrangement of the continuous conductor 664 and the pads 674 of the second conductor pattern is typically a mirror image of the arrangement of the continuous conductor 662 and pads 672 of the first conductor pattern.

The interposer 650 also includes vias such as via 676. When the base 652 is silicon, such vias are commonly referred to as "through silicon vias" (TSVs). Vias consist of a metal-coated or metal-filled hole through the base 652. Each via provides an electrical connection between one of the contact pads, such as pad 674, of the second conductor pattern and a corresponding pad on the external surface (i.e. the lower surface as shown in the figure) of the interposer 650. While FIG. 6, which is intended to illustrate the structure of the packaged SM XBAR filter 600, shows the TSVs formed prior to bonding the SM XBAR filter chip 605 and the interposer 650, the vias may be formed after bonding.

Figure 7:
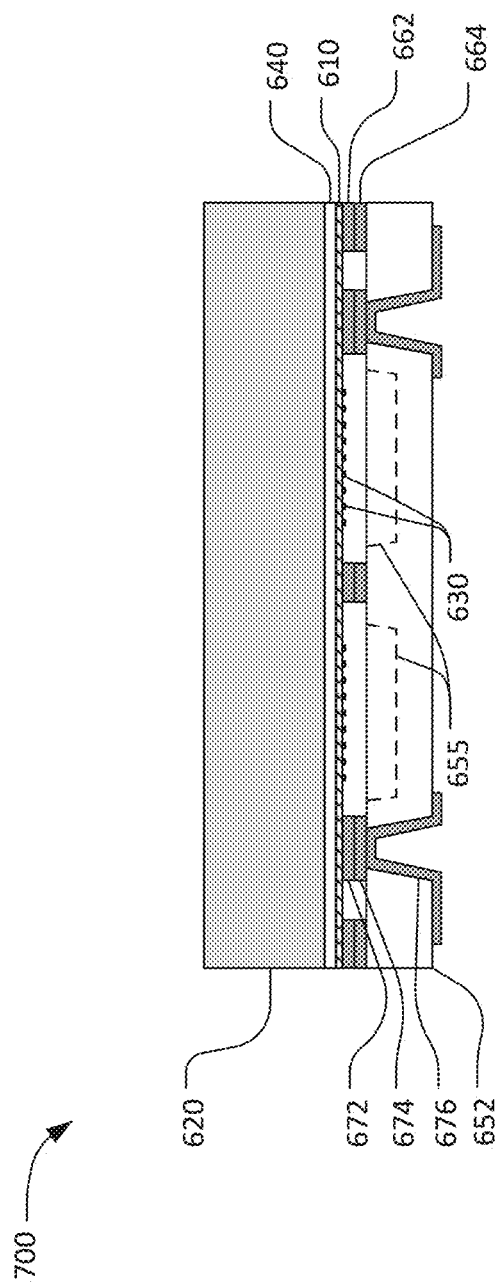
FIG. 7 is a schematic cross-sectional view of a packaged SM XBAR filter.

FIG. 7 is a schematic cross-sectional view of the packaged SM XBAR filter 600 after the SM XBAR filter chip 605 and the interposer 650 of FIG. 6 are bonded to each other. Descriptions of all of the identified elements in FIG. 7 were previously provided in the discussion of FIG. 6 and will not be repeated.

As shown in FIG. 7, the continuous conductor 662 around the perimeter of the SM XBAR filter chip 605 has been directly bonded to the continuous conductor 664 around the perimeter of the interposer 650 to create a hermetic seal around the perimeter of the packaged SM XBAR filter 600. In this context, the term "directly bonded" means bonded without any intervening adhesive. Simultaneously, the pads, such as pad 672, of the first conductor pattern have been directly bonded to the pads, such as pad 674, of the second conductor pattern to create electrical connections between the SM XBAR filter chip 605 and the interposer 650. The bonds between the continuous conductors and pads of the first and second conductor patterns may be accomplished by, for example, thermo-compression bonding or ultrasonic bonding.

Figure 8:
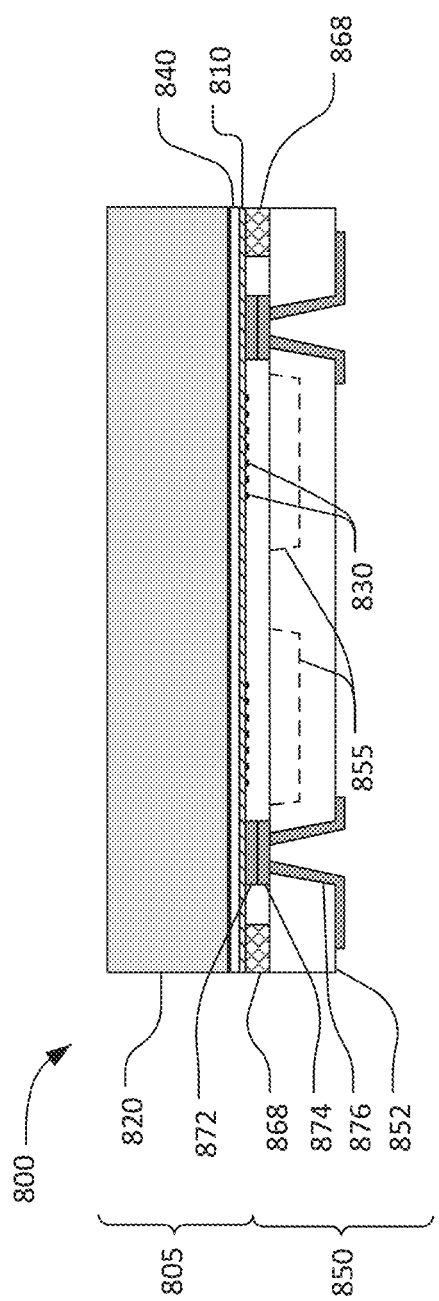
FIG. 8 is a schematic cross-sectional view of another packaged SM XBAR filter.

FIG. 8 is a schematic cross-sectional view of a packaged SM XBAR filter 800 including an SM XBAR filter chip 805 bonded to an interposer 850. With the exception of element 868, the identified elements in FIG. 8 have the structure and function as the corresponding elements of FIG. 6 and FIG. 7. Descriptions of these elements will not be repeated.

In the packaged SM XBAR filter 800, a perimeter seal between the SM XBAR filter chip 805 and the interposer 850 is not made by bonding continuous conductors (i.e. conductors 662, 664 in FIG. 7) around the perimeter of the SM XBAR filter chip and the interposer. Instead, a band of cured adhesive material 868 forms a perimeter seal between the SM XBAR filter chip 805 and the interposer 850. The cured adhesive material 868 may be, for example, an epoxy resin or other thermosetting adhesive. The adhesive material (in an uncured state) may be applied to either or both of the piezoelectric plate 810 and the base 852 before the piezoelectric plate 810 and the base 852 are assembled. The adhesive material may be cured after or concurrent with bonding the pads 872 to the pads 874.

The SM XBAR filter chips 605 and 805 shown in FIG. 6, FIG. 7, and FIG. 8 may be portions of large wafers containing many filter chips. Similarly, the interposers 650 and 850 may be portions of large wafers containing a corresponding number of interposers. An SM XBAR wafer and an interposer wafer may be bonded and individual packaged SM XBAR filters may be excised from the bonded wafers.

Figure 9:
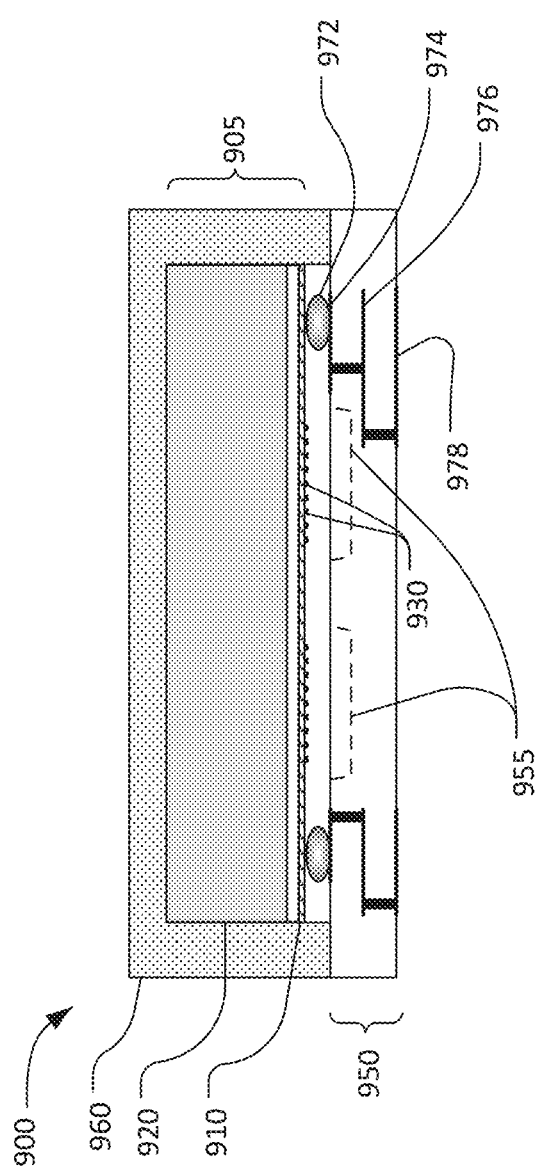
FIG. 9 is a schematic cross-sectional view of another packaged SM XBAR filter.

FIG. 9 is a schematic cross-sectional view of another packaged SM XBAR filter 900 including an SM XBAR filter chip 905 and interposer 950 that may be, for example, a low temperature cofired ceramic (LTCC) or a printed circuit board (PCB). As in the previous examples, the SM XBAR filter chip 905 includes a piezoelectric plate 910 attached to a substrate 920 with an acoustic Bragg reflector (not identified) sandwiched between the piezoelectric plate and the substrate. The substrate 920 may be high resistivity silicon or some other material. A first conductor pattern is formed on the surface of the piezoelectric plate 910. The conductor pattern includes IDTs with interleaved IDT fingers 930 and a first set of contact pads.

The interposer 950 may comprise layers of thin ceramic tape or other thin dielectric material, some or all of which bear printed conductors, that are assembled to form a rigid multilayer circuit board. In the example of FIG. 9, the interposer has three conductor layers 974, 976, 978. An LTCC or PCB interposer for an SM XBAR filter may have more than three layers. The surface of the interposer 950 facing the SM XBAR filter chip 905 has a second set of contact pads facing the first set of contact pads. The availability of multiple conductor layers allows incorporation of passive components, such as inductors, into the interposer.

The interposer 950 may have recesses 955 to ensure sufficient spacing between the IDT fingers 930 and the surfaces of the interposer facing the IDT fingers. Such recesses may be formed, for example, by punching openings in one or more of the dielectric layers prior to assembling the layers of the interposer.

The SM XBAR filter chip 905 is flip-chip mounted to the interposer 950. Flip-chip mounting establishes physical and electric connections between the SM XBAR filter chip 905 and the interposer 950. As shown in FIG. 9, the connections are made by means of solder balls, such as solder ball 972. Alternatively, the connections can be made by thermocompression or ultrasonic bonding of gold bumps or balls on the SM XBAR filter chip 905 and the interposer 950 (not shown). A plurality of conductive balls or bumps are used to connect the pads of the first set of contact pads to corresponding pads of the second set of contact pads.

Since flip-chip mounting does not establish a seal between the SM XBAR filter chip 905 and the interposer 950, a polymer cover 960 is molded or cast over the assembly to provide a near-hermetic seal.

Figure 10:
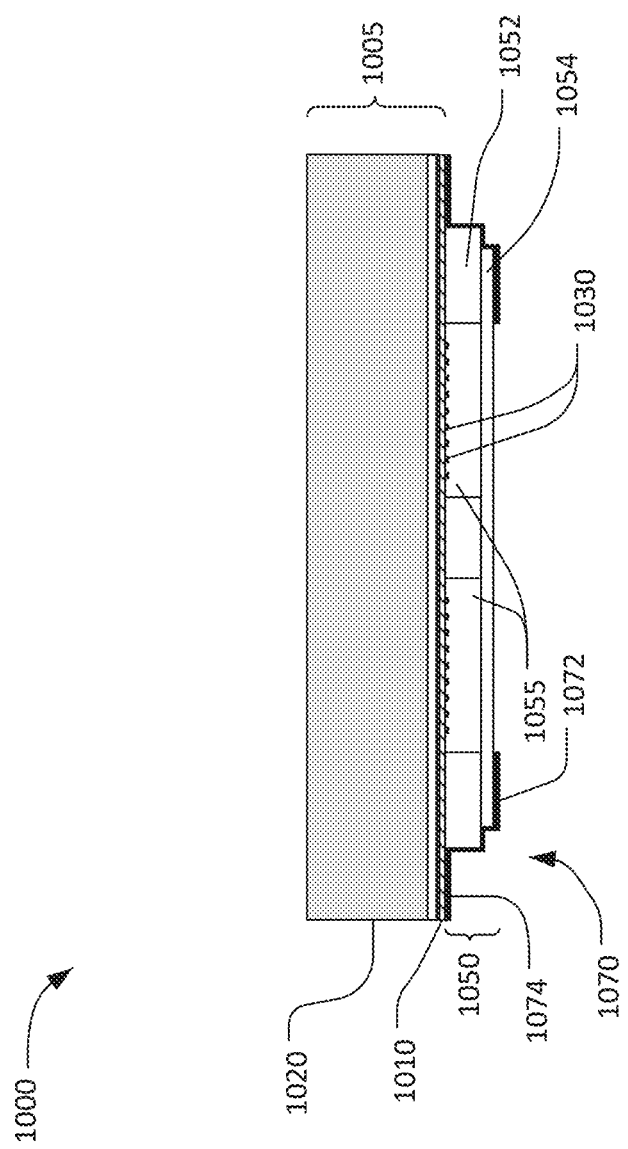
FIG. 10 is a schematic cross-sectional view of another packaged SM XBAR filter.

FIG. 10 is a schematic cross-sectional view of another packaged SM XBAR filter 1000 including an SM XBAR filter chip 1005 and an interposer 1050 formed by layers built up on the surface of the SM XBAR filter chip. The SM XBAR filter chip 1005 is a portion of a wafer (not shown) containing multiple SM XBAR filter chips. The build-up of the interposer layers is done on all of the SM XBAR filter chips on the wafer simultaneously. Individual packaged SM XBAR filters are then excised from the wafer.

As in previous examples, the SM XBAR filter chip 1005 includes a piezoelectric plate 1010 attached to a substrate 1020 with an acoustic Bragg reflector (not identified) sandwiched between the piezoelectric plate and the substrate. The substrate 1020 may be high resistivity silicon or some other material. A conductor pattern is formed on the surface of the piezoelectric plate 1010. The conductor pattern includes IDTs with interleaved IDT fingers, such as fingers 1030.

The interposer 1050 includes at least three layers sequentially formed on the piezoelectric plate 1010. Walls 1052 surround the IDTs of the SM XBAR devices. The thickness of the walls 1052 defines the distance between the IDTs and a cover layer 1054 that spans the walls creating an enclosed cavity 1055 over each IDT. Both the walls 1052 and the cover layer 1054 may be polymer materials. An interposer conductor pattern 1070 includes pads 1072 on the external surface of the cover layer 1054 for connection to circuitry external to the packaged SM XBAR filter. The conductor pattern 1070 connects the pads 1072 to connection points 1074 on the SM XBAR filter chip 1005. The conductor pattern 1070 may be aluminum, copper, gold, or a combination of materials.

Description of Methods

Figure 11:
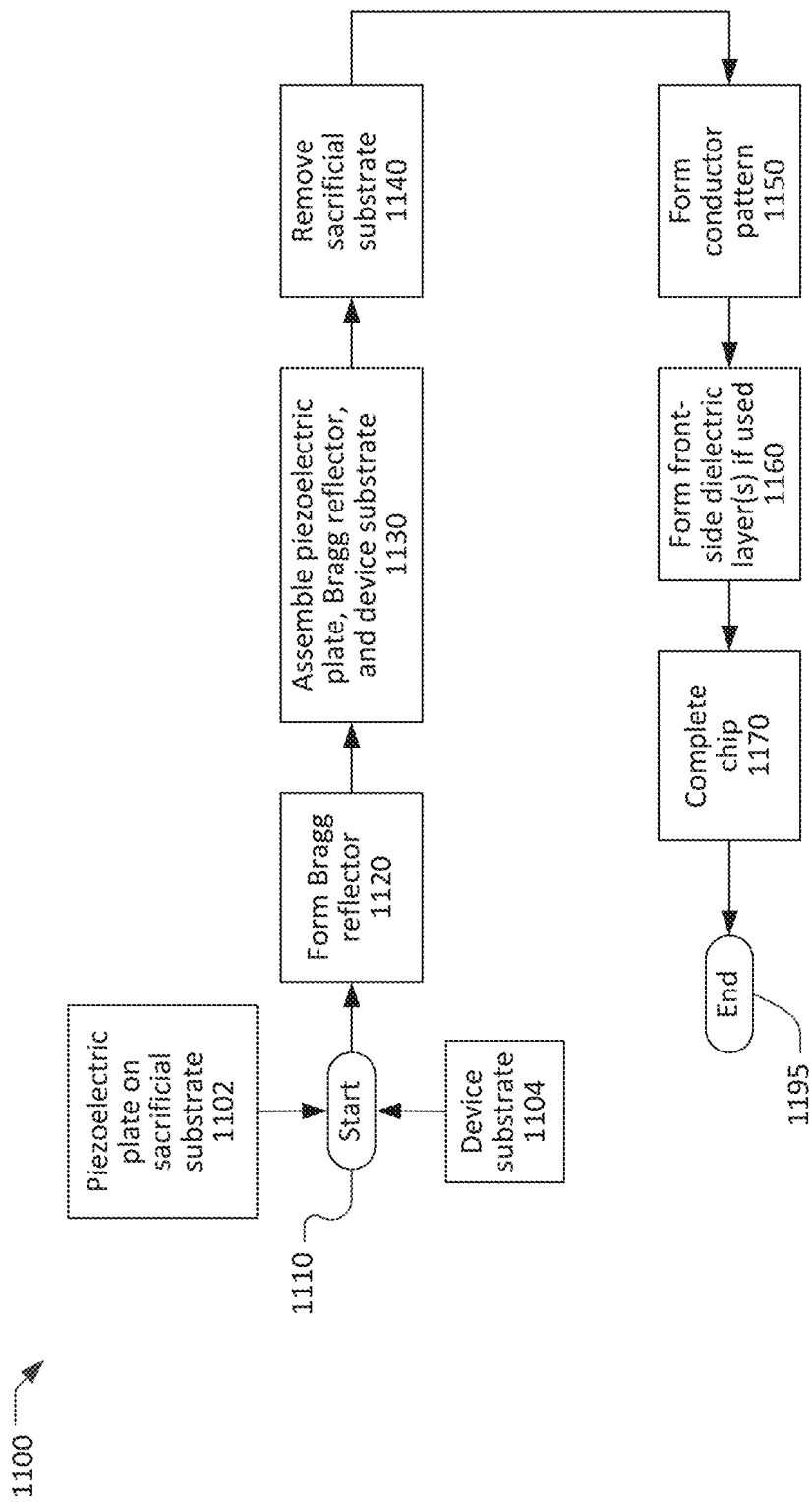
FIG. 11 is a flow chart of a process for fabricating an SM XBAR chip.

FIG. 11 is a simplified flow chart of a method 1100 for making a SM XBAR chip or a filter chip incorporating SM XBARs. The method 1100 starts at 1110 with a piezoelectric plate disposed on a sacrificial substrate 1102 and a device substrate 1104. The method 1110 ends at 1195 with a completed SM XBAR or filter. The flow chart of FIG. 11 includes only major process steps. Various conventional process steps (e.g. surface preparation, cleaning, inspection, baking, annealing, monitoring, testing, etc.) may be performed before, between, after, and during the steps shown in FIG. 11.

Thin plates of single-crystal piezoelectric materials bonded to a non-piezoelectric substrate are commercially available. At the time of this application, both lithium niobate and lithium tantalate plates are available bonded to various substrates including silicon, quartz, and fused silica. Thin plates of other piezoelectric materials may be available now or in the future. The thickness of the piezoelectric plate may be between 200 nm and 1000 nm. When the substrate is silicon, a layer of $SiO_2$ may be disposed between the piezoelectric plate and the substrate. The piezoelectric plate may be, for example, z-cut lithium niobate, yx-cut lithium niobate or some other material or crystal orientation. The device substrate 1104 may be silicon, fused silica, quartz, or some other material.

At 1120, an acoustic Bragg reflector is formed by depositing alternating layers of high acoustic impedance and low acoustic impedance materials. Each of the layers has a thickness equal to or about one-fourth of the acoustic wavelength. Materials having comparatively low acoustic impedance include silicon dioxide, silicon oxycarbide, aluminum, and certain plastics such as cross-linked polyphenylene polymers. Materials having comparatively high acoustic impedance include silicon nitride, aluminum nitride, hafnium oxide, diamond, diamond-like carbon, silicon carbide, and metals such as molybdenum, tungsten, gold, and platinum. All of the high acoustic impedance layers are not necessarily the same material, and all of the low acoustic impedance layers are not necessarily the same material. The total number of layers in the acoustic Bragg reflector may be from about five to more than twenty.

At 1120, all of the layers of the acoustic Bragg reflector may be deposited on either the surface of the piezoelectric plate on the sacrificial substrate 1102 or a surface of the device substrate 1104. Alternatively, some of the layers of the acoustic Bragg reflector may be deposited on the surface of the piezoelectric plate on the sacrificial substrate 1102 and the remaining layers of the acoustic Bragg reflector may be deposited on a surface of the device substrate 1104.

At 1130, the piezoelectric plate on the sacrificial substrate 1102 and the device substrate 1104 may be bonded such that the layers of the acoustic Bragg reflector are sandwiched between the piezoelectric plate and the device substrate. The piezoelectric plate on the sacrificial substrate 1102 and the device substrate 1104 may be bonded using a wafer bonding process such as direct bonding, surface-activated or plasma-activated bonding, electrostatic bonding, or some other bonding technique. Note that, when one or more layers of the acoustic Bragg reflector are deposited on both the piezoelectric plate and the device substrate, the bonding will occur between or within layers of the acoustic Bragg reflector.

After the piezoelectric plate on the sacrificial substrate 1102 and the device substrate 1104 are bonded, the sacrificial substrate and any intervening layers are removed at 1140 to expose the surface of the piezoelectric plate (the surface that previously faced the sacrificial substrate). The sacrificial substrate may be removed, for example, by material-dependent wet or dry etching, polishing, or some other process.

A first conductor pattern, including IDTs of each SM XBAR and a first set of contact pads, is formed at 1150 by depositing and patterning one or more conductor materials on the surface of the piezoelectric plate that was exposed when the sacrificial substrate was removed at 1140. The first conductor pattern may include two or more separately patterned conductor layers. A first conductor layer may be, for example, aluminum, an aluminum alloy, copper, a copper alloy, or some other conductive metal. Optionally, one or more other materials may be disposed below (i.e. between the conductor layer and the piezoelectric plate) and/or on top of the conductor layer. For example, a thin film of titanium, chrome, or other metal may be used to improve the adhesion between the conductor layer and the piezoelectric plate. A second conductor layer of gold, aluminum, copper or other higher conductivity metal may be formed over portions of the conductor pattern (for example the IDT bus bars, interconnections between the IDTs, and the first set of contact pads).

The first and second conductor layers may be formed at 1150 by depositing the conductor layer and, optionally, thin films of one or more other metals in sequence over the surface of the piezoelectric plate. The excess metal may then be removed by etching through patterned photoresist. The conductor layer can be etched, for example, by plasma etching, reactive ion etching, wet chemical etching, and other etching techniques.

Alternatively, the first and second conductor layers may be formed at 1150 using a lift-off process. Photoresist may be deposited over the piezoelectric plate and patterned to define the conductor pattern. The conductor layer and, optionally, one or more other layers may be deposited in sequence over the surface of the piezoelectric plate. The photoresist may then be removed, which removes the excess material, leaving the conductor pattern.

At 1160, one or more optional front-side dielectric layers may be formed by depositing one or more layers of dielectric material on the front side of the piezoelectric plate. The one or more dielectric layers may be deposited using a conventional deposition technique such as sputtering, evaporation, or chemical vapor deposition. The one or more dielectric layers may be deposited over the entire surface of the piezoelectric plate, including on top of the conductor pattern. Alternatively, one or more lithography processes (using photomasks) may be used to limit the deposition of the dielectric layers to selected areas of the piezoelectric plate, such as only between the interleaved fingers of the IDTs. Masks may also be used to allow deposition of different thicknesses of dielectric materials on different portions of the piezoelectric plate. For example, a first dielectric layer having a first thickness t1 may be deposited over the IDTs of one or more shunt resonators. A second dielectric layer having a second thickness t2, where t2 is equal to or greater than zero and less than t1, may be deposited over the IDTs of series resonators.

After the conductor pattern and optional front-side dielectric layer are formed at 1150 and 1160, the filter chip may be completed at 1170. Actions that may occur at 1170 include depositing an encapsulation/passivation layer such as $SiO_2$ or $Si_3O_4$ over all or a portion of the device and testing. Another action that may occur at 1170 is to tune the resonant frequencies of the resonators within the device by adding or removing metal or dielectric material from the front side of the device. After the filter chip is completed, the process ends at 1195.

A variation of the process 1100 starts with a single-crystal piezoelectric wafer at 1102 instead of a thin piezoelectric plate on a sacrificial substrate of a different material. Ions are implanted to a controlled depth beneath a surface of the piezoelectric wafer (not shown in FIG. 11). The portion of the wafer from the surface to the depth of the ion implantation is (or will become) the thin piezoelectric plate and the balance of the wafer is the sacrificial substrate. The acoustic Bragg reflector is formed at 1120 as previously described and the piezoelectric wafer and device substrate are bonded at 1130 such that the acoustic Bragg reflector is disposed between the ion-implanted surface of the piezoelectric wafer 1102 and the device substrate 1104. At 1140, the piezoelectric wafer may be split at the plane of the implanted ions (for example, using thermal shock), leaving a thin plate of piezoelectric material exposed and bonded to the acoustic Bragg reflector. The thickness of the thin plate piezoelectric material is determined by the energy (and thus depth) of the implanted ions. The process of ion implantation and subsequent separation of a thin plate is commonly referred to as "ion slicing".

Figure 12A:
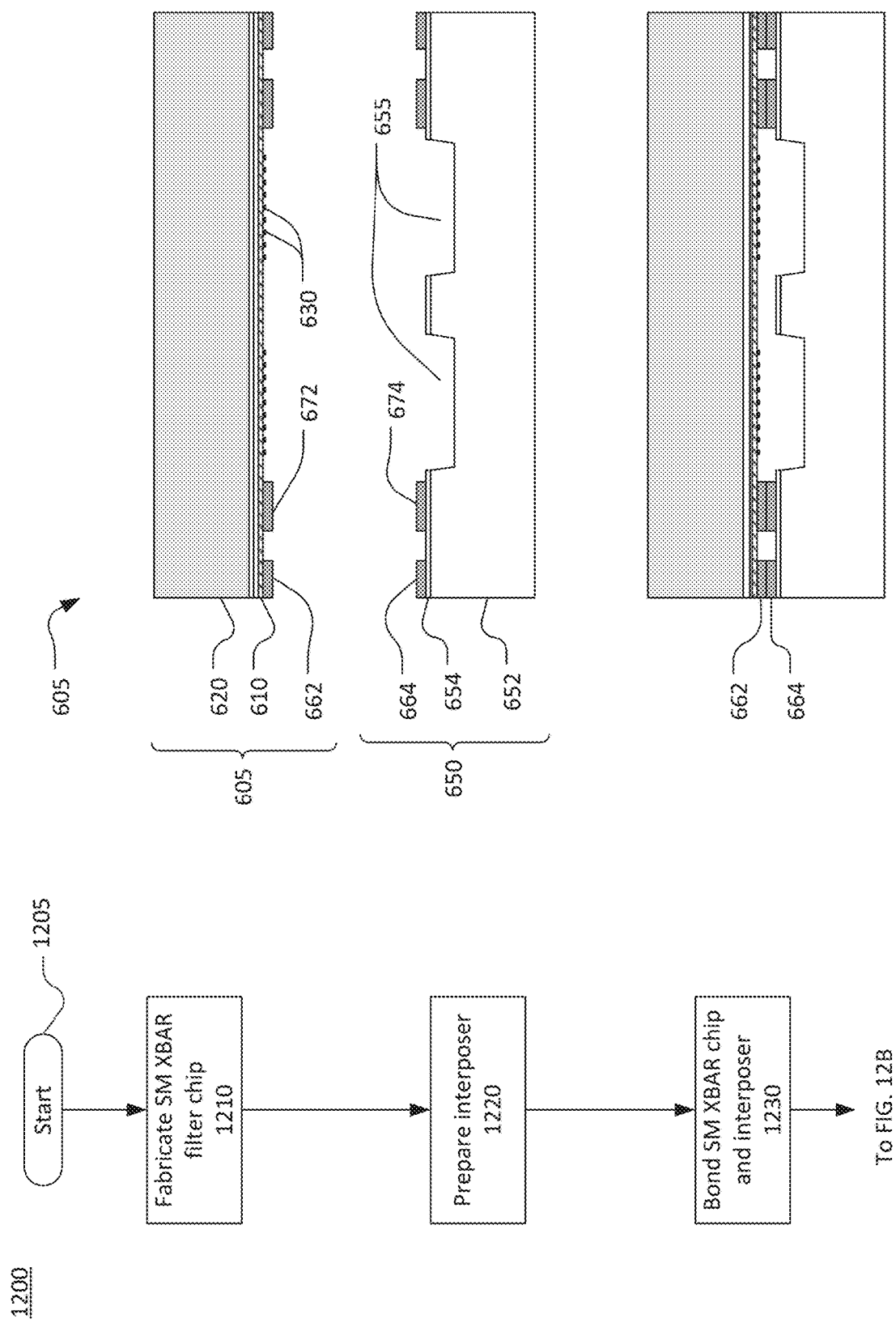
Figure 12B:
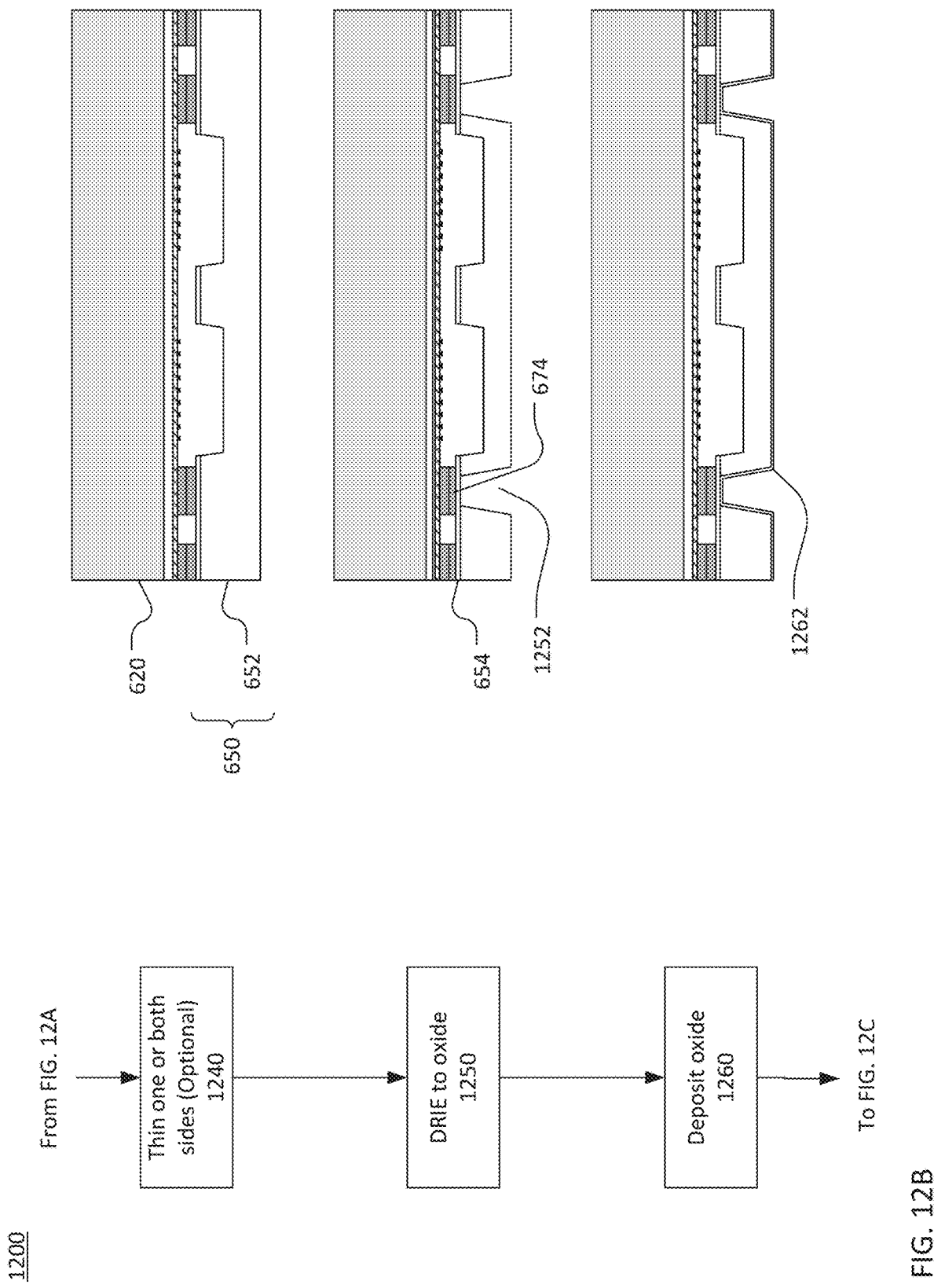

FIG. 12A, FIG. 12B, and FIG. 12C are, in combination, a flow chart of process 1200 for fabricating a packaged SM XBAR filter. While FIG. 12A, FIG. 12B, and FIG. 12C illustrate the process 1200 with a silicon interposer with TSVs (through silicon vias), the process 1200 may also use a PCB or LTCC interposer.

The process 1200 starts at 1205 and ends at 1295 with a completed packaged SM XBAR filter. FIG. 12A, FIG. 12B, and FIG. 12C show major process actions, each of which may involve multiple steps. Various conventional process steps (e.g. surface preparation, cleaning, inspection, baking, annealing, monitoring, testing, etc.) may be performed before, between, after, and during the steps shown in FIG. 12A, FIG. 12B, and FIG. 12C. For each major process action, a corresponding schematic cross-sectional view is provided to illustrate the configuration of the work-in-progress at the conclusion of the action. Where appropriate, reference designators previously used in FIG. 6 are used to identify elements of the work-in-progress.

Referring to FIG. 12A, at 1210, an SM XBAR filter chip 605 is fabricated using, for example, the process 1100 of FIG. 11. The SM XBAR filter chip 605 includes a piezoelectric plate 610 attached to a substrate 620 with an acoustic Bragg reflector (not identified) sandwiched between the piezoelectric plate and the substrate. The substrate 620 may be high resistivity silicon or some other material. A first conductor pattern is formed on the surface of the piezoelectric plate 610. The first conductor pattern has a first conductor level that includes IDTs with interleaved IDT fingers, such as fingers 630.

The first conductor pattern includes a second conductor level which may overlay portions of the first conductor level. The second conductor level may be gold, aluminum, copper or some other metal. The second conductor level of the first conductor pattern includes a continuous conductor 662 around the perimeter of the SM XBAR filter chip 605. The second conductor level also includes a first set of contact pads, such as pad 672, in locations where portions of the first conductor pattern must be connected to circuitry external to the packaged SM XBAR filter.

At 1220, a partially complete interposer 650 is prepared. Alternatively, but not shown in FIG. 12A, a fully completed interposer may be prepared at 1220. The partially complete interposer 650 includes a base 652, which may be high resistivity silicon or some other material. A dielectric layer 654, such as silicon dioxide, is formed on the surface of the base that will face the SM XBAR filter chip. The base 652 may have recesses 655 so that the surfaces of the base 652 that will face the IDTs (i.e. the bottoms of the recesses 655) are sufficiently far from the IDTs. The dielectric layer 654 may or may not cover the recesses 655. A second conductor pattern is formed on top of the dielectric layer 654. The second conductor pattern may be or include the same material as the second level of the first conductor pattern. The second conductor pattern includes a continuous metal conductor 664 around the perimeter of the base 652. The second conductor pattern also includes a second set of contact pads, such as pad 674, in locations where portions of the first conductor pattern must be connected to circuitry external to the packaged SM XBAR filter. The arrangement of the continuous conductor 664 and pads 674 of second conductor pattern is typically a mirror image of the arrangement of the ring 662 and pads 672 of the first conductor pattern.

At 1230, the SM XBAR filter chip 605 is bonded to the partially complete interposer 650. Specifically, the continuous conductor 662 of the first conductor pattern is bonded to the continuous conductor 664 of the second conductor pattern, forming a hermetic seal around the perimeter of the SM XBAR filter chip 605 and partially complete interposer 650. Simultaneously, pads on the SM XBAR filter chip 605 are bonded to corresponding pads, such as pad 674, on the partially complete interposer 650. A preferred method of bonding the SM XBAR filter chip 605 to the partially compete interposer 650 is thermocompression bonding, which uses a combination of heat and pressure to make bonds between metallic layers. Other methods, including ultrasonic bonding, and solder or eutectic bonding may be used.

Referring now to FIG. 12B, at 1240, one or both of the substrate 620 and the SM XBAR filter chip, and the base 652 of the partially completed interposer 650 optionally may be thinned to reduce the overall height of the packaged SM XBAR filter. The substrate 620 and/or the base 652 may be thinned, for example, by mechanical or chemo-mechanical polishing.

After the optional thinning of one or both of the substrate 620 and the base 652, through silicon via are formed in a sequence of actions from 1250 to 1280. The actions at 1250 to 1280 are specific to the use of a silicon wafer for the interposer base 652. When the interposer is a PCB or LTCC circuit card, a fully completed interposed may be prepared at 1220 (FIG. 12A), in which case the actions at 1250 to 1280 may not be performed.

At 1250, deep reactive ion etching (DRIE) is used to etch holes 1252 from the back side (the lower side as shown in FIG. 12B) of the base 652 through the base 652 to the dielectric layer 654. The dielectric layer 654 is not affected by the DRIE process, so the depth of the etch holes will be precisely controlled and uniform. The locations of the etched holes 1252 correspond to the locations of the pads, such as pad 674, of the second conductor pattern.

At 1260, a dielectric layer 1262 is deposited over the back side of the base 652 and the interiors of the holes 1252. The dielectric layer may be silicon dioxide, silicon nitride, aluminum oxide, or some other dielectric material. The dielectric layer may be deposited by a conventional process such as evaporation, sputtering, chemical vapor deposition, or some other process.

Referring now to FIG. 12C, at 1270, the dielectric layer at the ends of the holes 1252 is etched through a patterned photoresist mask to expose at least a portion of each contact pad (such as pad 674) of the second conductor pattern.

At 1280, a third conductor pattern 1256 is formed to create electric connections from the pads, such as pad 674 of the second conductor pattern, to corresponding pads, such as pad 676 on the exterior surface (the lower surface as shown in FIG. 12C) of the base 652. The third conductor pattern may include a primary conductive layer of gold, aluminum, copper or some other highly conductive material. A thin layer of some other metal, such as titanium or nickel may be disposed between the primary conductive layer and the base 652 to improve adhesion. The structures including the holes 1252 and the third conductor pattern 1256 are commonly referred to as "through silicon vias". Once the through silicon vias are complete, the process 1200 ends at 1295.

The entire process 1200 may be, and commonly will be, performed on whole wafers. A whole wafer containing multiple SM XBARs filter chips will be bonded to another wafer containing a corresponding number of partially complete interposers at 1230. The subsequent actions form TSVs for all of the interposers simultaneously. Individual packaged SM XBAR filters may then be excised by dicing the bonded wafers after action 1230.

Figure 13:
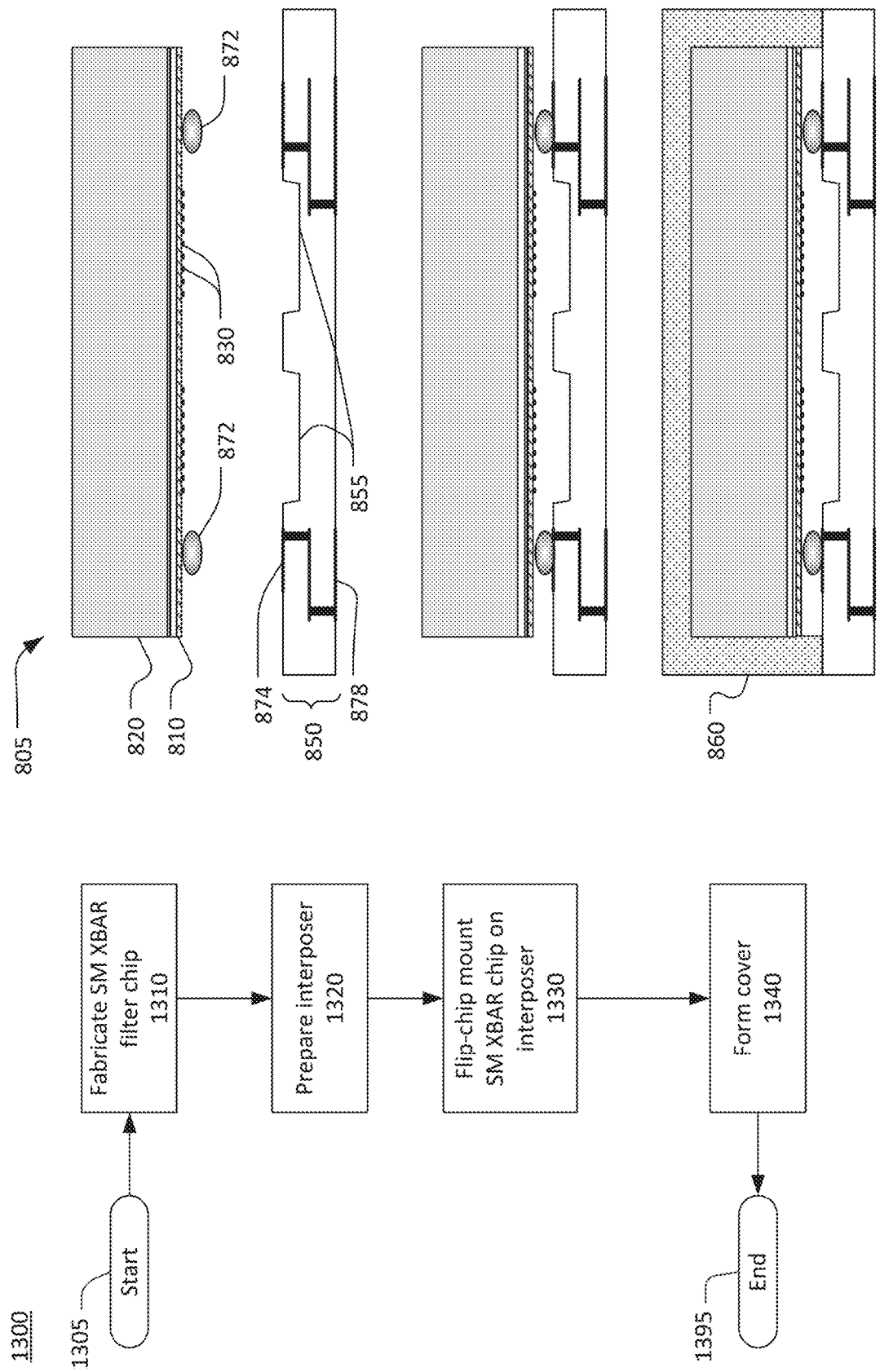
FIG. 13 is a flow chart of another process for packaging an SM XBAR filter.

FIG. 13 is a flow chart of another process 1300 for fabricating a packaged SM XBAR filter using an LTCC or PCB interposer. While FIG. 13 illustrates the process 1300 with an LTCC interposer, the same process can be used with a PCB interposer.

The process 1300 starts at 1305 and ends at 1395 with a completed packaged SM XBAR filter. FIG. 13 shows major process actions, each of which may involve multiple steps. Various conventional process steps (e.g. surface preparation, cleaning, inspection, baking, annealing, monitoring, testing, etc.) may be performed before, between, after, and during the steps shown in FIG. 13. For each major process action, a corresponding schematic cross-sectional view is provided to illustrate the configuration of the work-in-progress at the conclusion of the action. Where appropriate, reference designators previously used in FIG. 8 are used to identify elements of the work-in-progress.

At 1310, a SM XBAR filter chip 805 is fabricated using, for example, the process 1100 of FIG. 11. The SM XBAR filter chip 805 will typically be a portion of a wafer containing multiple SM XBAR filter chips. The SM XBAR filter chip 805 includes a piezoelectric plate 810 attached to a substrate 820. An acoustic Bragg reflector (not identified) is sandwiched between the piezoelectric plate 810 and the substrate 820. The substrate 820 may be high resistivity silicon or some other material.

A first conductor pattern, including at least first and second conductor levels, is formed on the surface of the piezoelectric plate 810. The first conductor level includes IDTs with interleaved IDT fingers, such as fingers 830. The second conductor level, which may overlay portions of the first conductor level, may be gold, aluminum, copper or some other metal. The second conductor level may include a first set of contact pads (not identified) in locations where portions of the first conductor pattern must be connected to circuitry external to the packaged SM XBAR filter. Solder balls or bumps 872 may be formed on the pads to allow the SM XBAR filter chip 805 to be reflow soldered to an interposer. Alternatively, gold balls or bumps may be formed on the pads to allow the SM XBAR filter chip 805 to be thermocompression bonded or ultrasonic bonded to an interposer. In another alternative, the balls or bumps may be formed on the interposer rather than the SM XBAR filter chip.

At 1320, an interposer 850 is fabricated by assembling thin dielectric layers, some or all of which bear printed conductors. The layers of an LTCC interposer may be ceramic tape co-fired to form a rigid multilayer circuit card. The layers of a PCB interposer may be thin reinforced plastic sheets that are adhesive bonded to form a rigid multilayer circuit card. In either case, interposer 850 will typically be a portion of a larger panel including multiple interposers. The interposer has at least an upper (as shown in FIG. 13) conductor pattern 874 that includes a second set of contact pads for connections to the SM XBAR filter chip and a lower conductor pattern 878 that includes a third set of contact pads for connection to circuitry external to the packaged SM XBAR filter. In the example of FIG. 13, the interposer 850 includes one intermediate conductor layer. An LTCC or PCB interposer for an SM XBAR filter may have more than three conductor layers. The availability of multiple conductor layers allows incorporation of passive components, such as inductors, into the interposer.

The LTCC interposer 850 may have recesses 855 to ensure sufficient spacing between the IDTs and the surfaces of the interposer facing the IDTs. Such recesses may be formed, for example, by punching openings in one or more of the ceramic layers prior to cofiring the layers of the interposer.

At 1330, the SM XBAR filter chip 850 is flip-chip bonded to the interposer 850. First, the SM XBAR filter chips within a wafer are tested, and good chips are excised from the wafer. The good chips are then bonded to the LTCC interposer 850 by soldering, thermocompression bonding, ultrasonic bonding, or some other bonding method. The bonding physically attaches the SM XBAR filter chip 805 to the interposer 850 and makes electrical connections between the SM XBAR filter chip 805 and the interposer 850. The bonding typically does not make a seal to protect the SM XBAR filter chip 805.

At 1340, a polymer cover 860 is formed over the SM XBAR filter chip 805 to seal the space between the SM XBAR filter chip 805 and the interposer 850. The cover 850 may be formed by injection molding or casting, for example. Individual covers may be formed over each SM XBAR filter chip, or a unitary cover 850 may be formed over the entire LTCC panel. In either case, packaged SM XBAR filters may be excised from the panel by, for example, sawing. The process 1300 then ends at 1395.

Figure 14:
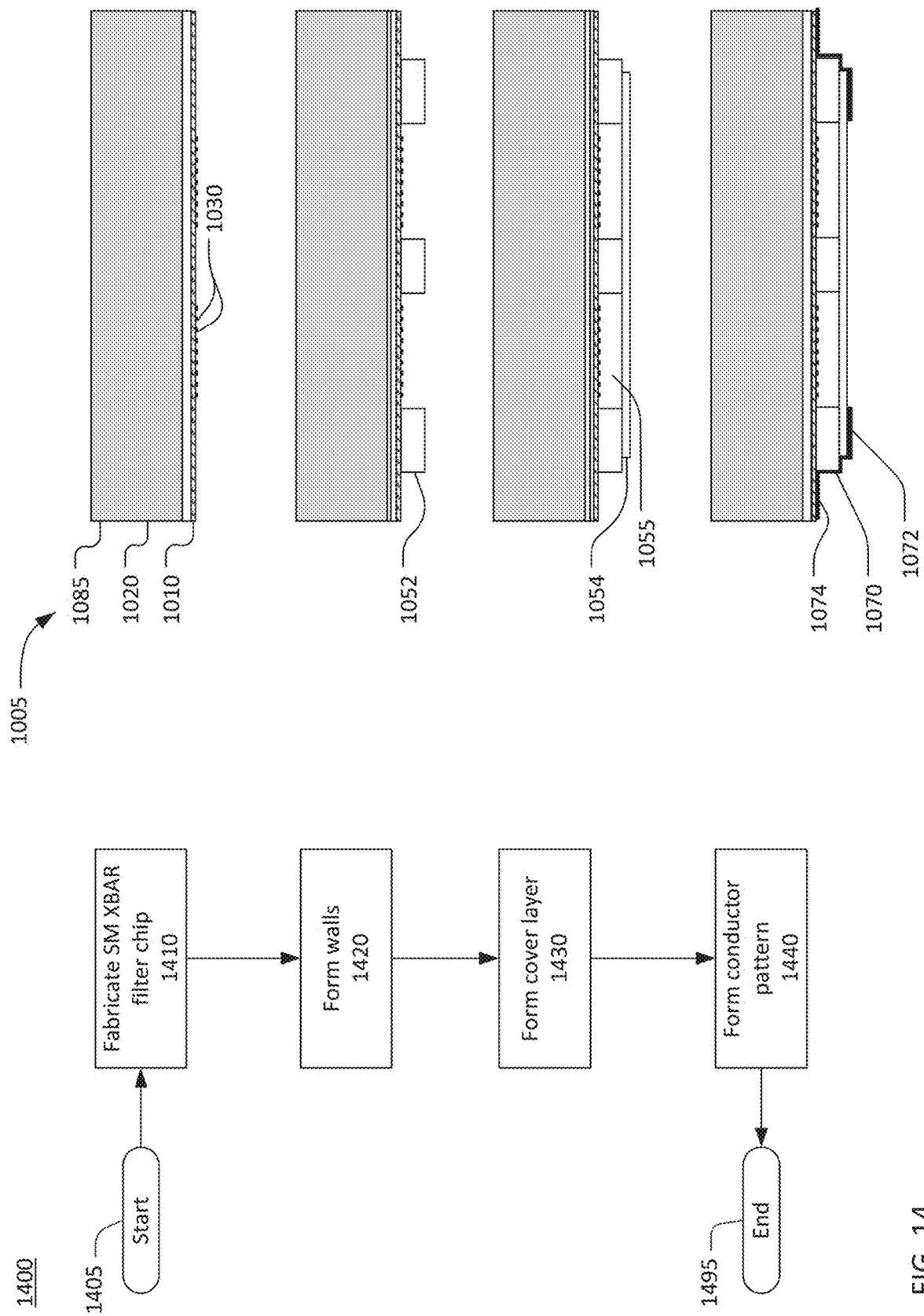
FIG. 14 is a flow chart of another process for packaging an SM XBAR filter.

FIG. 14 is a flow chart of another process 1400 for fabricating a packaged SM XBAR filter using a wafer-level built up interposer. The process 1400 starts at 1405 and ends at 1495 with a completed packaged SM XBAR filter. FIG. 14 shows major process actions, each of which may involve multiple steps. Various conventional process steps (e.g. surface preparation, cleaning, inspection, baking, annealing, monitoring, testing, etc.) may be performed before, between, after, and during the steps shown in FIG. 14. For each major process action, a corresponding schematic cross-sectional view is provided to illustrate the configuration of the work-in-progress at the conclusion of the action. Where appropriate, reference designators previously used in FIG. 10 are used to identify elements of the work-in-progress.

At 1410, a SM XBAR filter chip 1005 is fabricated using, for example, the process 1100 of FIG. 11. The SM XBAR filter chip 1005 will typically be a portion of a wafer containing multiple SM XBAR filter chips. The SM XBAR filter chip 1005 includes a piezoelectric plate 1010 attached to a substrate 1020. The substrate 1020 may be high resistivity silicon or some other material. An acoustic Bragg reflector (not identified) is sandwiched between the substrate and the piezoelectric plate. A first conductor pattern is formed on the surface of the piezoelectric plate 1010. The first conductor pattern includes IDTs with interleaved IDT fingers, such as fingers 1030.

At 1420, walls 1052 are formed on the piezoelectric plate 1010. The walls 1052 may be formed with openings over the SM XBAR IDTs and openings where electrical connections to the SM XBAR filter chip will be made in a subsequent process action. The walls 1052 may be formed, for example, by coating the piezoelectric plate 1010 with a photopolymerizable material and then exposing the photopolymerizable material through a suitable mask. Depending on the required thickness of the walls, multiple layers of material may be coated and patterned in succession.

A 1430, a cover layer 1054 is applied over the walls 1052. The cover layer 1054 may be applied, for example, as a continuous film bonded to the walls 1052 by an adhesive. The cover layer 1054 spans the openings in the walls 1052 over the SM XBAR IDTs, forming an enclosed cavity 1055 over each IDT. The cover layer is patterned to form openings where electrical connections to the SM XBAR filter chip will be made in a subsequent process action.

At 1440, a conductor pattern 1070 is formed. The conductor pattern 1070 includes pads 1072 on the external surface of the cover layer for connection to circuitry external to the packaged SM XBAR filter. The conductor pattern 1070 connects the pads 1072 to connection points 1074 on the SM XBAR filer chip 1005. The conductor pattern 1070 may be aluminum, copper, gold, or a combination of materials deposited and patterned using conventional techniques. Once the conductor pattern is formed, the process 1400 ends at 1495.

The entire process 1400 may be, and commonly will be, performed on whole wafers. Individual packaged SM XBAR filters may then be excised by sawing through the bonded wafers after the conductor pattern is formed at 1440.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. An acoustic resonator device comprising:
   an acoustic resonator chip comprising:
      a substrate;
      a piezoelectric layer having front and back surfaces;
      a first conductor pattern on the front surface of the piezoelectric layer, the first conductor pattern comprising a first plurality of contact pads and an interdigital transducer (IDT), the IDT and the piezoelectric layer configured such that a radio frequency signal applied to the IDT excites a primary shear acoustic mode within the piezoelectric layer; and
      an acoustic Bragg reflector between a surface of the substrate and the back surface of the piezoelectric layer, the acoustic Bragg reflector configured to reflect the shear primary acoustic mode;
   an interposer comprising a second conductor pattern that includes a second plurality of contact pads on a surface of the interposer that faces the acoustic resonator chip; and
   a continuous metal seal around a perimeter of the piezoelectric layer and perimeter of the interposer, the continuous metal seal being spaced apart from the first and second plurality of contact pads and configured to seal the IDT in a cavity of the acoustic resonator device,
   wherein the interposer comprises a plurality of conductor layers with vias connecting the second plurality of contact pads to a third plurality of contact pads on a surface of the interposer that is not facing the IDT,
   wherein each contact pad of the first plurality of contact pads is connected to a respective contact pad of the second plurality of contact pads, and
   wherein at least one of the contact pads of the first plurality of contact pads is connected to at least one of the contact pads of the second plurality of contact pads by thermocompression or ultrasonic bonding.

2. The acoustic resonator device of claim 1, wherein the acoustic Bragg reflector is configured to reflect the primary shear acoustic mode over a frequency range comprising a resonance frequency and an anti-resonance frequency of the acoustic resonator device.

3. The acoustic resonator device of claim 1, wherein the seal comprises an adhesive material.

4. The acoustic resonator device of claim 1, wherein the interposer comprises a silicon base; and the vias are through silicon vias.

5. The acoustic resonator device of claim 1, wherein the interposer is a low temperature co-fired ceramic circuit card.

6. The acoustic resonator device of claim 1, wherein the interposer is a printed circuit board.

7. The acoustic resonator device of claim 1, wherein the interposer further comprises a recess facing the IDT.

8. A filter device comprising:
an acoustic resonator chip comprising:
a substrate;
a piezoelectric layer having front and back surfaces;
a first conductor pattern on the front surface of the piezoelectric layer, the first conductor pattern comprising a first plurality of contact pads and interdigital transducers (IDTs) of a plurality of acoustic resonators comprising a shunt resonator and a series resonator;
an acoustic Bragg reflector between a surface of the substrate and the back surface of the piezoelectric layer;
a first dielectric layer on and between interleaved fingers of the IDT of the shunt resonator and having a first thickness; and
a second dielectric layer on and between the interleaved fingers of the IDT of the series resonator and having a second thickness less than the first thickness;
an interposer comprising a second conductor pattern having a second plurality of contact pads on a surface of the interposer that faces the acoustic resonator chip; and
a continuous metal seal around a perimeter of the piezoelectric layer and a perimeter of the interposer, the continuous metal seal being spaced apart from the first and second plurality of contact pads and configured to seal the IDT in a cavity of the acoustic resonator device,
wherein the interposer comprises a plurality of conductor layers,
wherein each contact pad of the first plurality of contact pads is connected to a respective contact pad of the second plurality of contact pads, and
wherein at least one of the contact pads of the first plurality of contact pads is connected to at least one of the contact pads of the second plurality of contact pads by thermocompression or ultrasonic bonding.

9. The filter device of claim 8, wherein:
the piezoelectric layer and all of the IDTs are configured such that radio frequency signals applied to the IDTs excite respective primary shear acoustic modes in the piezoelectric layer, and
the acoustic Bragg reflector is configured to reflect the respective primary shear acoustic modes excited by all of the IDTs.

10. The filter device of claim 9, wherein the acoustic Bragg reflector is configured to reflect the primary shear acoustic modes excited by all of the IDTs over a frequency range comprising a resonance frequency and an anti-resonance frequency of all of the plurality of acoustic resonators.

11. The filter device of claim 8, wherein the seal comprises an adhesive material.

12. The filter device of claim 8, wherein the interposer further comprises vias connecting the second plurality of contact pads to a third plurality of contact pads on a surface of the interposer that is not facing the IDTs.

13. The filter device of claim 12, wherein the interposer comprises a silicon base; and the vias are through silicon vias.

14. The filter device of claim 12, wherein the interposer is a low temperature co-fired ceramic circuit card.

15. The filter device of claim 12 wherein the interposer is a printed circuit board.

16. The filter device of claim 8, wherein the interposer further comprises a plurality of recesses in the surface of the interposer facing the IDTs of the plurality of acoustic resonators.

17. A filter device comprising:
an acoustic resonator chip comprising:
a substrate;
a piezoelectric layer having front and back surfaces;
a first conductor pattern on the front surface of the piezoelectric layer, the first conductor pattern comprising a first plurality of contact pads and interdigital transducers (IDTs) of a plurality of acoustic resonators comprising a shunt resonator and a series resonator;
an acoustic Bragg reflector between a surface of the substrate and the back surface of the piezoelectric layer;
a first dielectric layer on and between interleaved fingers of the IDT of the shunt resonator and having a first thickness; and
a second dielectric layer on and between the interleaved fingers of the IDT of the series resonator and having a second thickness less than the first thickness;
an interposer comprising a second conductor pattern that includes a second plurality of contact pads on a surface of the interposer that faces the acoustic resonator chip; and
a seal connecting the piezoelectric layer to the interposer to seal the shunt resonator and the series resonator within an internal cavity of filter device,
wherein each contact pad of the first plurality of contact pads is connected to a respective contact pad of the second plurality of contact pads,
wherein the interposer comprises a plurality of recesses in the surface of the interposer facing the IDTs of the plurality of acoustic resonators, and
wherein each of the plurality of recesses has a depth such that a distance from a bottom of each recess to the respective IDT is greater than or equal to 15 microns and less than or equal to 100 microns.

* * * * *